United States Patent
Dean et al.

(10) Patent No.: US 8,204,727 B2
(45) Date of Patent: Jun. 19, 2012

(54) COMPUTER-IMPLEMENTED SYSTEMS AND METHODS FOR USE IN MODELING A GEOMECHANICAL RESERVOIR SYSTEM

(75) Inventors: Ricky Howard Dean, Plano, TX (US); Joseph Henry Schmidt, Galveston, TX (US)

(73) Assignee: Chevron U.S.A. Inc., San Ramon, CA (US)

(*) Notice: Subject to any disclaimer, the term of this patent is extended or adjusted under 35 U.S.C. 154(b) by 456 days.

(21) Appl. No.: 12/561,854

(22) Filed: Sep. 17, 2009

(65) Prior Publication Data
US 2010/0076738 A1    Mar. 25, 2010

Related U.S. Application Data

(60) Provisional application No. 61/098,604, filed on Sep. 19, 2008, provisional application No. 61/164,766, filed on Mar. 30, 2009.

(51) Int. Cl.
*G06G 7/48* (2006.01)

(52) U.S. Cl. .............................................. 703/10; 703/9
(58) Field of Classification Search ............... 703/9, 10
See application file for complete search history.

(56) References Cited

OTHER PUBLICATIONS

Lim et al. "A New Approach for Residual and Jacobian Array Construction in Reservoir Simulators" SPE 28248, 1995.*
Minkoff et al. "Coupled fluid flow and geomechanical deformation modeling" Elsevier 2003.*
Jing Wan "Stabilized Finite Element Methods for Coupled Geomechanics and Multiphase Flow" Nov. 2002.*

* cited by examiner

*Primary Examiner* — Saif Alhija
(74) *Attorney, Agent, or Firm* — Christopher D. Northcutt; Nicholas F. Gallo; Craig R. Vander Ploeg

(57) ABSTRACT

Computer-implemented systems and methods are provided for modeling a geomechanical reservoir system to provide fracturing predictions. The model predictions are generated by solving a system of partial differential equations that model the geomechanical reservoir system.

19 Claims, 22 Drawing Sheets

COMPUTER-IMPLEMENTED SYSTEMS AND METHODS FOR USE IN MODELING A GEOMECHANICAL RESERVOIR SYSTEM

1. CROSS-REFERENCE TO RELATED APPLICATIONS

This application claims priority to U.S. Provisional Application No. 61/098,604, filed Sep. 19, 2008 and U.S. Provisional Application No. 61/164,766, filed Mar. 30, 2009, which are incorporated herein by reference in their entirety.

2. TECHNICAL FIELD

This document relates to computer-implemented systems and methods for use in modeling a geomechanical reservoir system.

3. BACKGROUND

There are several different fracture simulators that predict hydraulic fracture geometry in these geomechanical reservoir systems, both finite element (Papanastasiou, P. C., 1997, Int. J. Rock Mech & Min. Sci., 34:3-4, Paper No. 240; Lam et al., SPE 15266, SPE Unconventional Gas Technology Symposium, Louisville, Ky., May 18-21, 1986; Lujun et al., 2007, SPE 110845, SPE annual Technical Conference and Exhibition, Anaheim, Calif., Nov. 11-14, 2007) and boundary element (Clifton et al., 1979, SPE 7943, SPE/DOE Low Permeability Gas Reservoirs Symposium, Denver, Colo., May 20-22, 1979; Rungamornrat et at, 2005, SPE 96968, SPE Annual Technical Conference and Exhibition, Dallas, Tex. Oct. 9-12, 2005; Yew et al., 1993, SPE 22875, *SPE Production & Facilities,* 8: 171-177). However, there is a need for improvements in modeling geomechanical reservoir systems.

4. SUMMARY

As disclosed herein, computer-implemented systems and methods are provided for modeling a geomechanical reservoir system. For example, a system and method can be configured to: receive data indicative of physical properties associated with the geomechanical reservoir system and generate fracturing predictions by solving a system of partial differential equations that model the geomechanical reservoir system.

As another example, a system and method can further include the system of partial differential equations comprising a reservoir flow model, a geomechanical model, and a fracture model of the geomechanical reservoir system; wherein the system of partial differential equations is coupled through a fully-expanded Jacobian; wherein the solving of the system of partial differential equations includes solving simultaneously in a single time step the fully-expanded Jacobian based upon the received physical properties data. The method can comprise outputting or displaying the generated fracturing predictions to a user, user interface device, a computer readable storage medium, a monitor, a local computer, or a computer that is part of a network.

As another example, a system and method can be configured for use in modeling a fracture in a geomechanical reservoir system, comprising: receiving data indicative of physical properties associated with the geomechanical reservoir system; defining a three-dimensional grid comprising a plurality of three-dimensional cells, wherein each of the three-dimensional cells comprises a plurality of nodes; defining a two-dimensional grid comprising a plurality of two-dimensional cells, wherein each of the two-dimensional cells comprises a plurality of nodes, and wherein each of the two-dimensional cells shares at least four nodes with a three-dimensional cell; generating fracturing predictions by solving a system of partial differential equations that model the geomechanical reservoir system; wherein the system of partial differential equations comprises a reservoir flow model, a geomechanical model, and a fracture model of the geomechanical reservoir system; wherein the system of partial differential equations is coupled through a fully-expanded Jacobian; wherein the solving of the system of partial differential equations includes solving simultaneously in a single time step the fully-expanded Jacobian based upon the received physical properties data; wherein the reservoir model and the geomechanical model are computed on the three-dimensional grid; and wherein the fracture model is computed on the two-dimensional grid. The method can comprise outputting or displaying the generated fracturing predictions to a user, user interface device, a computer readable storage medium, a monitor, local computer, or a computer that is part of a network.

With respect to coupling, a variable in the fully-expanded Jacobian that can be used to couple fluid flow in the reservoir to the geomechanical model can be: effective stress, porosity and one or more displacements associated with the geomechanical model. A variable in the fully-expanded Jacobian that couples the geomechanical model to the fluid flow can be: porosity, fluid pressure and permeability associated with the reservoir flow model; wherein a variable in the fully-expanded Jacobian that couples the geomechanical model to the fracture model can be: fracture width associated with the fracture model; and wherein a variable in the fully-expanded Jacobian that couples fluid flow in the reservoir to the fracture model can be a leakoff rate associated with the fracture model.

The system of partial differential equations further may also comprise a thermal model of the geomechanical reservoir system. A variable in the fully-expanded Jacobian that couples the thermal model to the geomechanical model can be: conduction and convection associated with the thermal model; and a variable in the fully-expanded Jacobian that couples the thermal model to the reservoir flow model can be fluid viscosity and thermal stress associated with the thermal model.

5. BRIEF DESCRIPTION OF THE DRAWINGS

Figure 1:
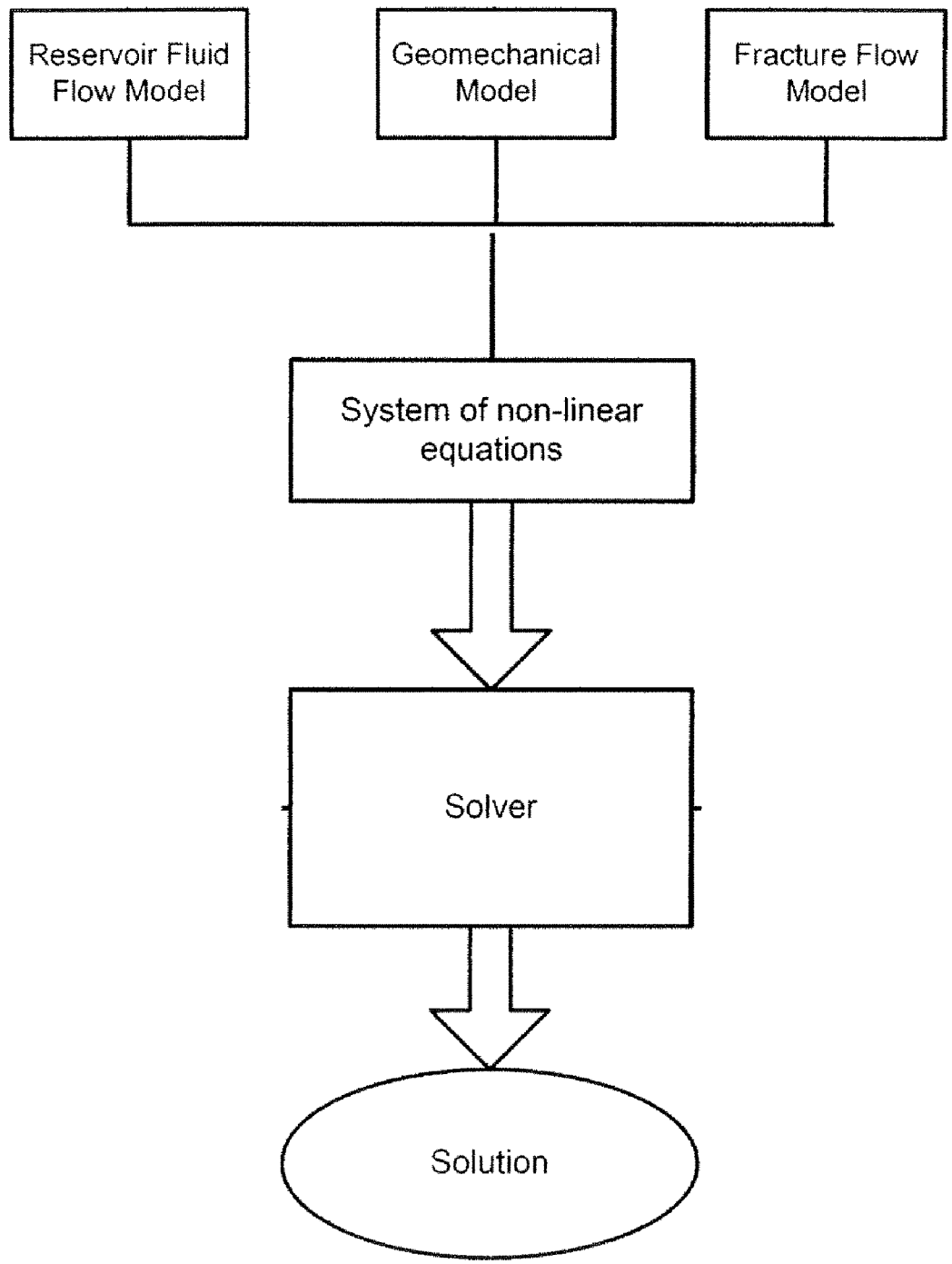
FIG. 1 is a block diagram of an example approach for use in modeling a geomechanical reservoir system including a reservoir model, a geomechanical model, and a fracture flow model.

6. DETAILED DESCRIPTION 6.1 Examples of Geomechanical Reservoir Modeling Methods FIG. 1 depicts an example of a computer-implemented system for modeling a geomechanical reservoir system. The modeling system includes a plurality of models that describe various physical aspects of the geomechanical reservoir system, such as a reservoir fluid flow model, a geomechanical model, and a fracture flow model. The reservoir fluid flow model describes, e.g., porous flow, production and injection. The geomechanical reservoir model describes, e.g., stresses, strains, and displacement that arise when fluids are injected into or produced from a reservoir and when stresses are applied to the boundaries of a reservoir. The fracture flow model describes, e.g., flow in the fracture and leakoff from the fracture into the reservoir. A system of non-linear partial differential equations interrelates the various aspects of these models.

After receiving data representative of the physical properties associated with the geomechanical reservoir system that is to be analyzed, a solver generates predictions (e.g., fracturing predictions) by solving the system of partial differential equations. In the solver of FIG. 1, the system of partial differential equations is coupled through a fully-expanded Jacobian. The solving of the system of partial differential equations includes solving simultaneously in a single time step the fully-expanded Jacobian based upon the received physical properties data. The generated fracturing predictions can be output to various components, such as output to a user interface device, a computer readable storage medium, a monitor, a user-accessible local computer, or a user-accessible computer that is part of a network.

Figure 2:
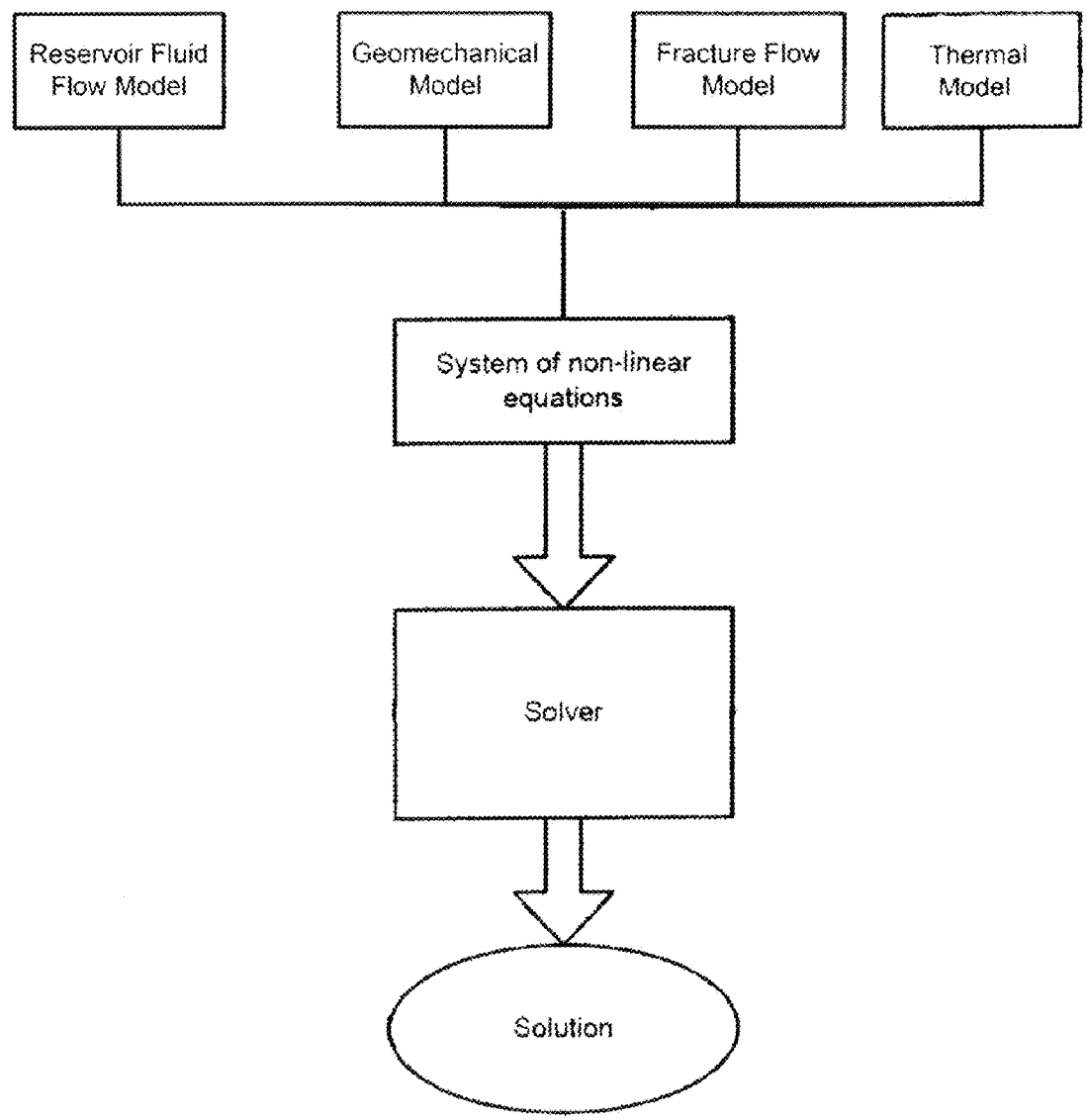
FIG. 2 is a block diagram of an example approach for use in modeling a geomechanical reservoir system including a reservoir model, a geomechanical model, a fracture flow model, and a thermal model.
Figure 3:
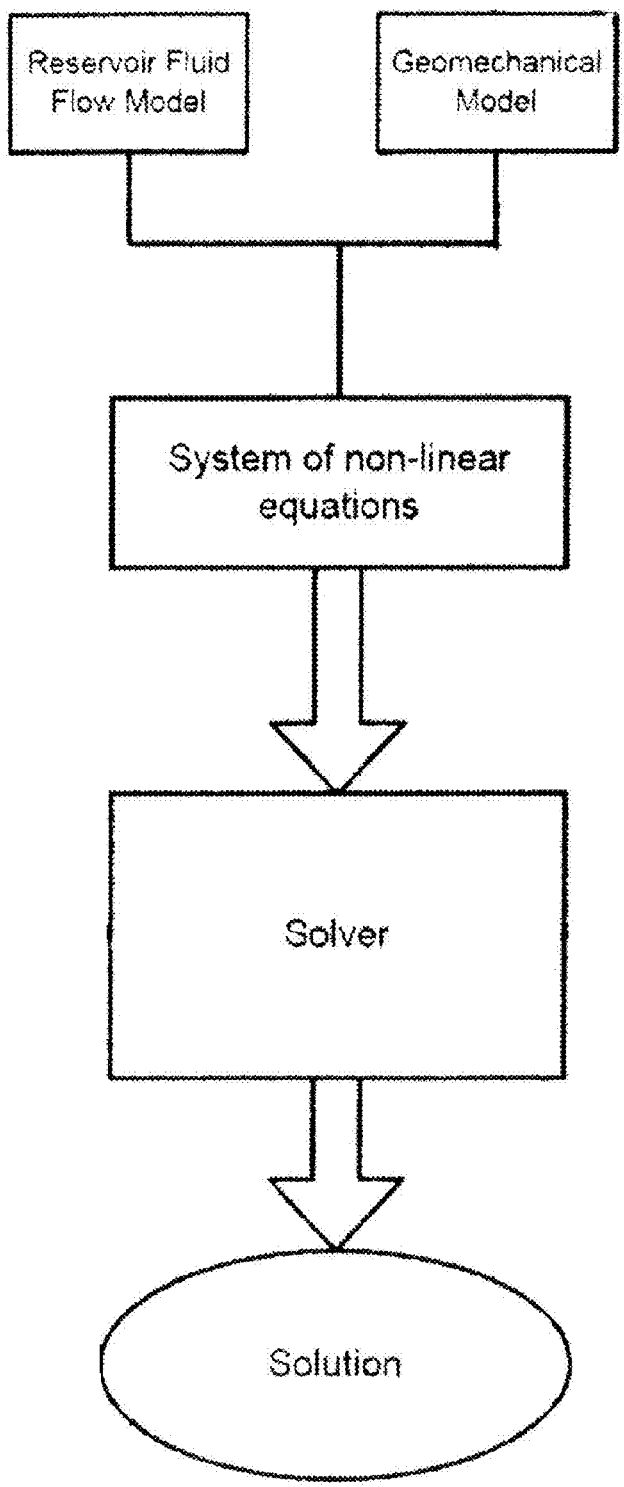
FIG. 3 is a block diagram of an example approach for use in modeling a geomechanical reservoir system including a reservoir model and a geomechanical model.
Figure 4:
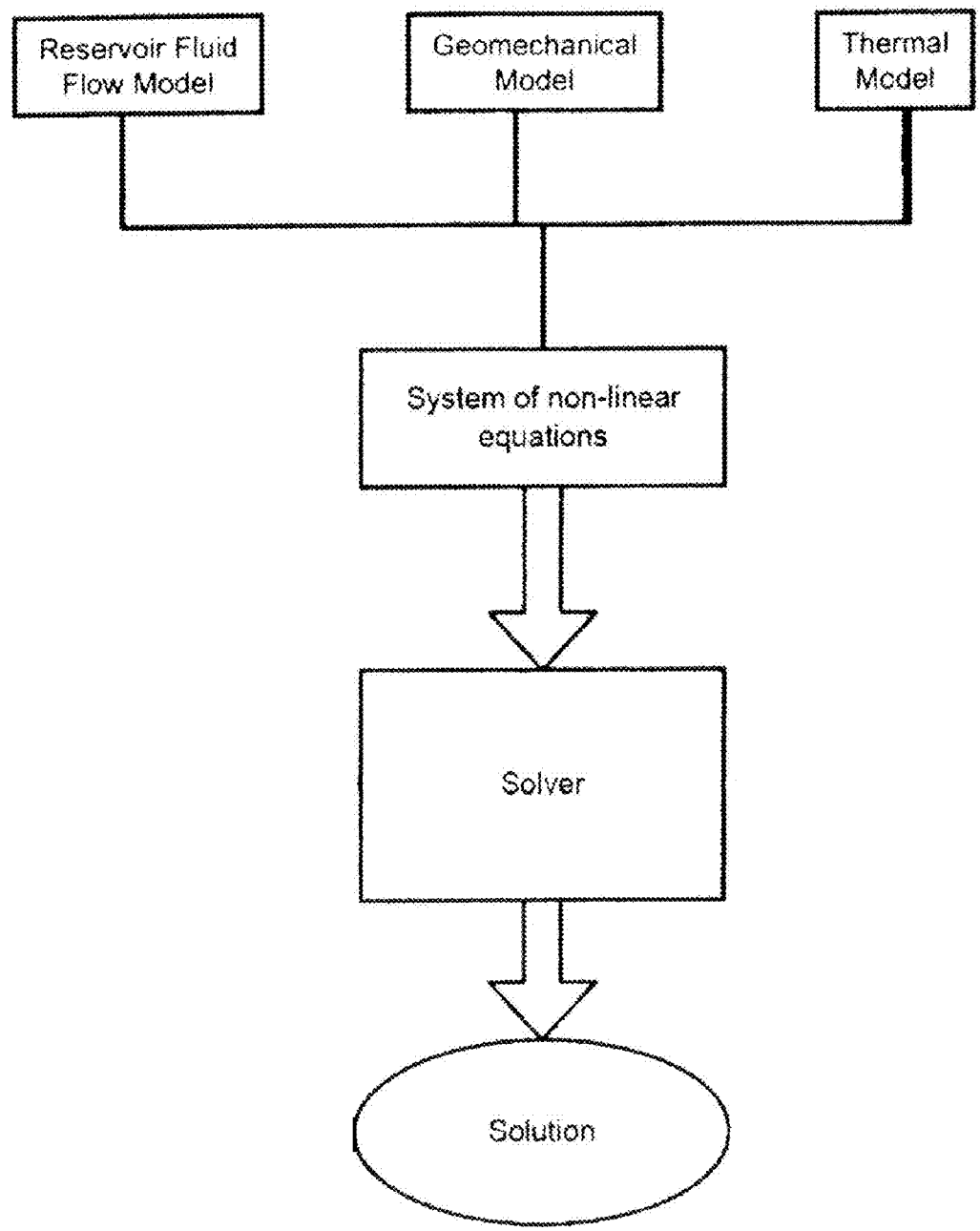
FIG. 4 is a block diagram of an example approach for use in modeling a geomechanical reservoir system including a reservoir model, a geomechanical model, and a thermal model.

The non-linear system of partial differential equations comprises equations that correspond to what models are to be used in analyzing the geomechanical reservoir system. For example and as discussed above, FIG. 1 provides an example where the non-linear system of partial differential equations includes equations corresponding to a reservoir flow model, a geomechanical model, and a fracture model of the geomechanical reservoir system. As another illustration, FIG. 2 provides an example where the non-linear system of partial differential equations includes equations corresponding to a reservoir flow model, a geomechanical model, a fracture model and a thermal model of the geomechanical reservoir system. In FIG. 3, the non-linear system of partial differential equations includes equations corresponding to a reservoir flow model and a geomechanical model of the geomechanical reservoir system. In FIG. 4, the non-linear system of partial differential equations includes equations corresponding to a reservoir flow model, a geomechanical model and a thermal of the geomechanical reservoir system. Examples of equations that correspond to each of the different models of the geomechanical reservoir system are provided in Section 6.3 infra.

A method for modeling a geomechanical reservoir system can also combine hydraulic fracture growth, multi-phase/multi-component Darcy/non-Darcy porous flow, heat convection and conduction, solids deposition, and poroelastic/poroplastic deformation in a single application. Still further, the differential equations for the different mechanisms such as fracture width changes, laminar channel flow in the fracture, porous flow in the reservoir, heat convection and conduction, and poroelastic/poroplastic deformations can be combined to produce an implicit fully-coupled formulation. The model can include poroplasticity, which accounts for fracture generation in weakly consolidated formations, and can be capable of modeling compositional multiphase fluid injection with flow between the fractures and reservoir. A method can be capable of modeling growing fractures in poroelastic/poroplastic materials involving complex phase behavior including EOR and thermal processes.

Coupling of the various aspects of the models can be implemented such as through variables in a fully-expanded Jacobian. For example, a fully-expanded Jacobian can act to couple fluid flow in the reservoir to the geomechanical model by one or more of the following variables: effective stress, a porosity and one or more displacements associated with the geomechanical model. A variable in the fully-expanded Jacobian that couples the geomechanical model to the fluid flow can be porosity and permeability that is associated with the reservoir flow model. A variable in the fully-expanded Jacobian that couples the geomechanical model to the fracture model can be fracture width associated with the fracture model. A variable in the fully-expanded Jacobian that couples fluid flow in the reservoir to the fracture model can be fluid pressure and a leakoff rate associated with the fracture model. A variable in the fully-expanded Jacobian that couples the thermal model to the geomechanical model can be a thermal stress associated with the thermal model. A variable in the fully-expanded Jacobian that couples the thermal model to the reservoir flow model can be fluid viscosity, conduction and convection in the reservoir associated with the thermal model. The fully-expanded Jacobian may include terms related to a rate of change (i.e., a partial time derivative or a time derivative), a spatial derivative, or partial spatial derivative, of a coupling variable, where the derivatives can be of any order, for example, a first-order derivative, a second-order derivative, a third-order derivative, etc. First-, second-, third- and/or higher-order derivatives (whether time derivatives or spatial derivatives) of the coupling variables can be included in the fully-expanded systems of equations. Examples of variables that may couple the different models are provided in Section 6.4 infra.

A system and method can provide for prediction of fracture growth by applying different fracture propagation models (described in Section 6.5 infra) to the geomechanical reservoir system. For example, the profile of a fracture may be predicted through parameters input into the fracture model (Section 6.5.1). In another example, the evolving profile of a fracture is predicted based on a different fracture propagation criteria. That is, fracture growth computations may be modeled based on critical stress intensity factors (Section 6.5.2), or based on cohesive elements that exhibit strain-softening behavior (Section 6.5.3). These two fracture propagation criteria may be coupled (Section 6.5.4). Other features of the fracture growth prediction are discussed in Sections 6.5.6 and 6.5.7.

A system and method can be configured to allow a dry zone to develop at the fracture tip as a natural part of the solution process, as discussed in Section 6.5.5. In particular, the system and method can be capable of modeling fracture growth based on the two different fracture propagation criteria at the fracture tip and also allow a dry zone to develop naturally at the tip of a propagating fracture. For example, a dry zone develops at the tip of a propagating fracture when there is a large pressure drop down the fracture.

The nonlinear system of equations of the fully-expanded Jacobian can be solved through numerical approaches, such as the approach discussed in greater detail in Section 6.6, wherein the nonlinear system of equations is solved, e.g., using a full Newton-Raphson expansion of all solution variables, which enhances solution stability and allows second order convergence rates for the nonlinear iterations. Examples of apparatus and computer-program implementations of the different methods disclosed herein are discussed in Section 6.7.

Figure 5:
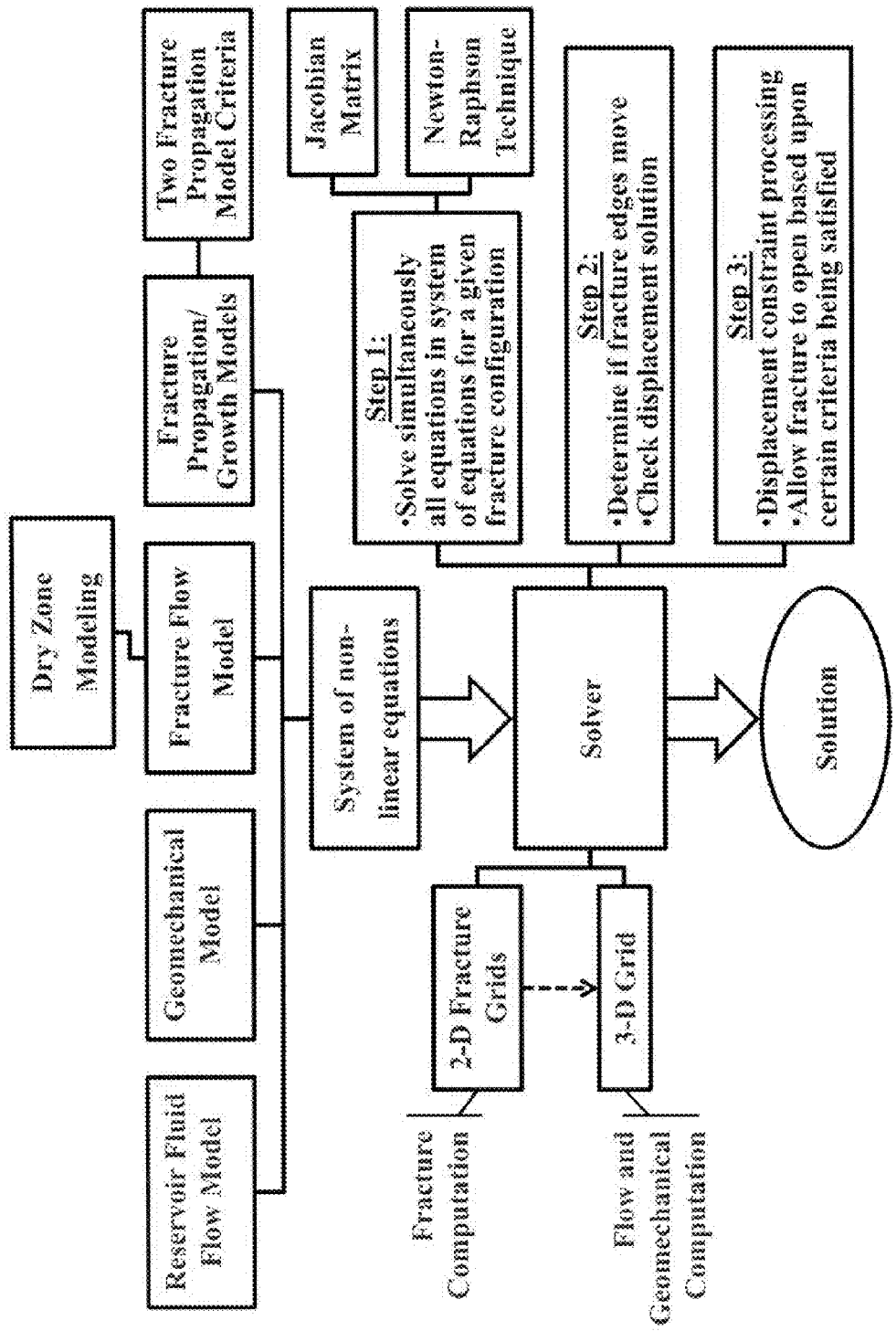
FIG. 5 is a block diagram of an example approach for use in modeling a geomechanical reservoir system including a reservoir model, a geomechanical model, and a fracture flow model, where a fracture propagation growth model predicts the fracture profile.

In another aspect, a method can include the steps of receiving data indicative of physical properties associated with the geomechanical reservoir system, defining a three-dimensional grid comprising a plurality of three-dimensional cells, wherein each of the three-dimensional cells comprises a plurality of nodes, defining a two-dimensional grid comprising a plurality of two-dimensional cells, wherein each of the two-dimensional cells comprises a plurality of nodes, and wherein each of the two-dimensional cells shares at least four nodes with a three-dimensional cell, and generating fracturing predictions by solving a system of partial differential equations that model the geomechanical reservoir system. The system of partial differential equations can comprise a reservoir flow model, a geomechanical model, and a fracture model of the geomechanical reservoir system. The system of partial differential equations is coupled through a fully-expanded Jacobian, where the solving of the system of partial differential equations, such as by using a computer, includes solving simultaneously in a single time step the fully-expanded Jacobian based upon the received physical properties data. The reservoir model and the geomechanical model are computed on the three-dimensional grid, while the fracture model is computed on the two-dimensional grid. The generated fracturing predictions are output to a user, a user interface device, a computer readable storage medium, a monitor, local computer, or a computer that is part of a network. FIG. 5 illustrates that fracture propagation growth models are used to predict the fracture profile, and also illustrates a dry zone is modeled. The grids used in the simulation methods herein are described in Section 6.2.

Separate grids can be used for modeling flow in the fracture (and, e.g., in the reservoir, etc.). Solving the nonlinear system of equations implicitly, e.g., using a full Newton-Raphson expansion of solution variables, can enhance numerical stability (e.g., when dealing with fracture growth, cavity generation, or with any simulation that involves very small grid blocks). Modeling the fracture flow separate from the reservoir flow allows one to account for a dry zone at the fracture tip, and using a fully expanded Jacobian from an implicitly coupled system of equations provides more stability for the solution process.

Other example approaches are shown in Appendix A of U.S. Provisional Application No. 61/098,604, which is attached hereto.

6.2 Simulation Method

Figure 6:
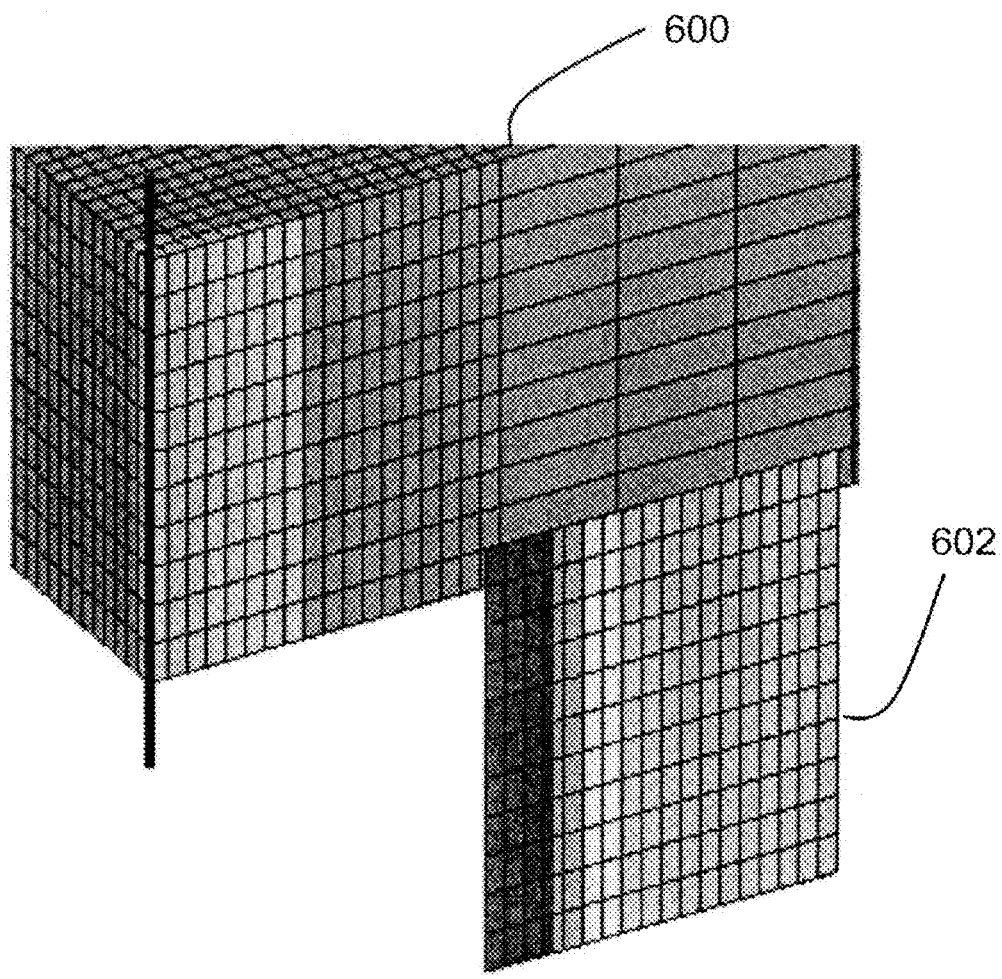
FIG. 6 illustrates an example of a two-dimensional grid used for computations of the fracture flow model and an example of a three-dimensional grid used for computations of other models.

Separate grids are used for modeling flow in the fracture and in the other systems, such as in the reservoir. FIG. 6 illustrates an example of a two-dimensional (2D) grid 602 for computations of the fracture flow model and a three-dimensional (3D) grid 600 for computations of the other models. For example, one or more of the multi-point flux (such as for reservoir and porous flow) model, the geomechanical model (such as for computing stress and displacement), and the thermal model, may be computed on the 3D grid. The two-dimensional (2D) grid is used for computing flow down the fracture (i.e., hydraulic fracture simulations). The separate grids for fracture computation and the other model(s) can use a parallel processing approach to couple the grids.

The 3D grid may be structured or unstructured hexahedral grids comprising hexahedral elements. A hexahedral grid cell has eight corners, twelve edges (or sides), and six faces. The hexahedral grid cells may each include at least eight nodes (one at each corner), or more and up to twenty-seven (27) nodes (I.e., a node at the center of each face, the center of each side, the center of each edge, and in the center of the cell). Different hexahedral cells may include different numbers of nodes.

The 20 grid may be structured or unstructured quadrilaterals grids comprising quadrilateral elements. Each quadrilateral grid cell has four corners and four edges. The quadrilateral grid cells each include at least four nodes (one at each corner) and up to five nodes (i.e., a node at the center). The nodes of the 2-D grid can be configured to coincide with the nodes on one of the outer boundaries of the 3D grid and certain computations, such as fracture widths and 3D displacements, are coupled at common node points. Also, the computations on the 2D grid may be axisymmetric two-dimensional (2D) computations.

Figure 7:
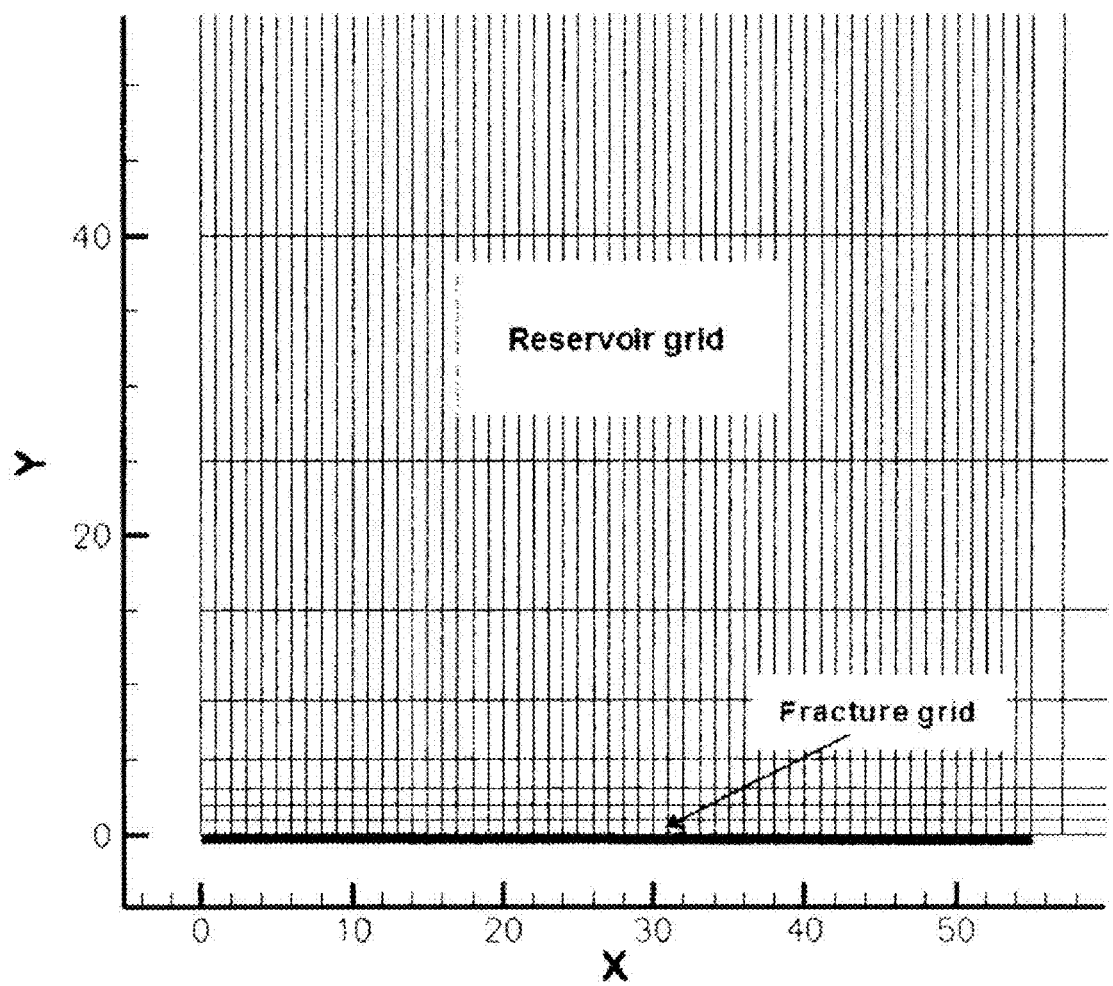
FIG. 7 illustrates reservoir and fracture grids used in a computation, where distances are in the units of feet.

Fractures are simulated using the various disclosed methods by using a 2D mesh to represent a single 2-D fracture surface where the location of the surface is specified using 3D coordinates. The 2D fracture mesh can be a general 2D surface and does not need to lie in a single plane. The input data format for 2D fracture grids can be very similar to the format for 3D reservoir grids. A grid can be identified as being a fracture grid by specifying the dimensions or coordinates of the grid cells. Connectivity between the 2D fracture grids and the 3D reservoir grid is determined by comparing the four nodes that define a fracture cell with the four nodes that define each surface of each reservoir cell. FIG. 7 illustrates a view of reservoir and fracture grids used in a computation, where distances are in the units of feet.

For certain computations, the quadrilateral fracture elements in the 2D fracture grids are aligned with faces of the hexahedral elements in the 3D geomechanical/porous flow grid in order for parameters, such as fluid flow, displacements, fracture width, and tractions, to be consistent between the separate grids. As an example of a structure of the algorithms in a program (for implementing the methods disclosed herein) that accounts for the interactions between the fracture and reservoir grids, such a structure can be similar to the structure of the algorithms that are implemented in applications that have been developed to run on parallel processing systems having distributed memory.

Multiple hydraulic fractures may be introduced in a single simulation, e.g., using several 2D grids. The 2D fracture grids can be restricted to being along the sides, top, or bottom of a three-dimensional grid.

6.3 Models

Examples of the differential equations that correspond to each of the different models of the geomechanical reservoir system are provided below. The differential equations for the models included in a computation are combined to produce an implicit, fully-coupled formulation. A consistent set of units is used for all variables in equations included in a computation.

6.3.1 Reservoir Model

Figure 8:
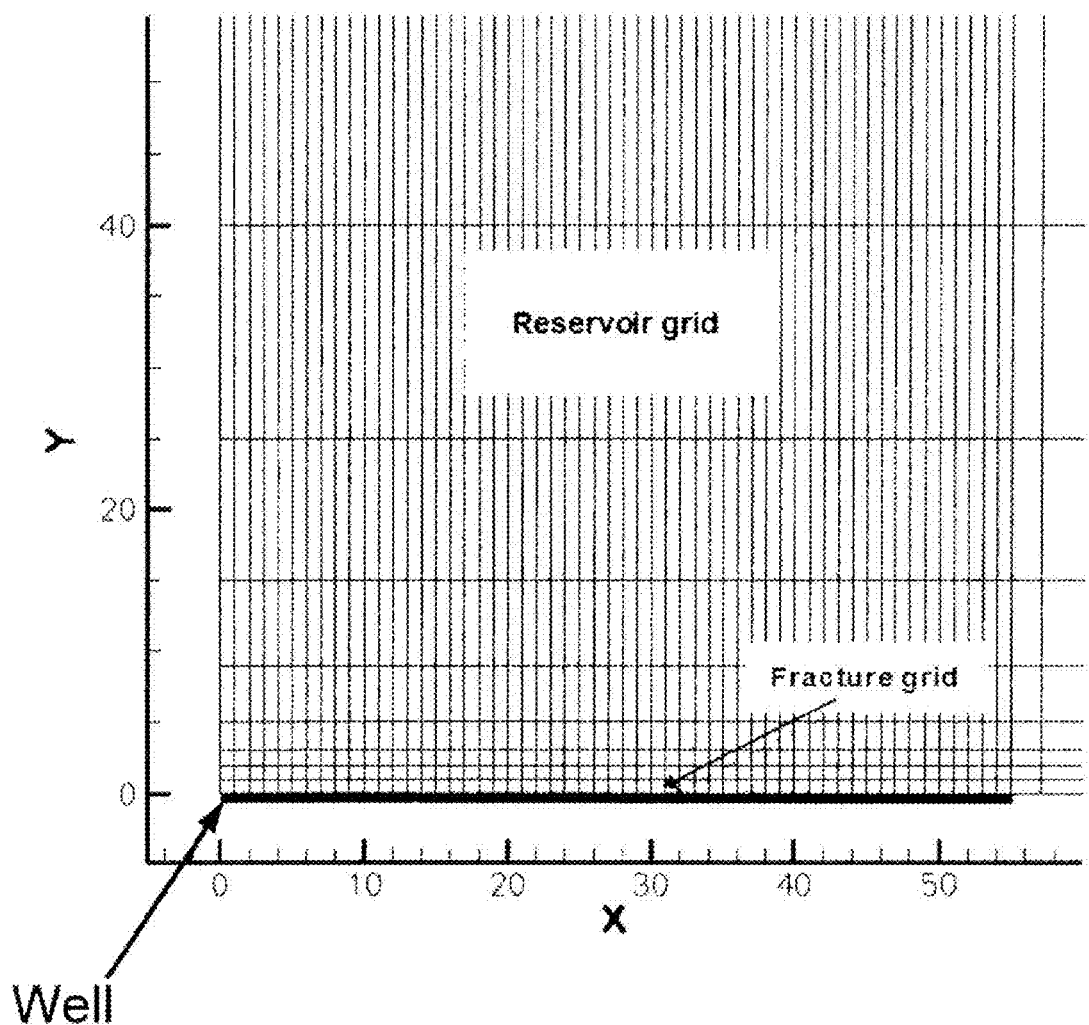
FIG. 8 illustrates the location of a well relative to the reservoir and fracture grids shown in FIG. 7.

The system of equations for porous flow include conservation of mass $$\frac{\partial}{\partial t}(\rho\phi) = -\nabla\cdot(\rho\vec{U}) + q_w, \quad (1)$$

where $\phi$ is porosity and $\rho$ is fluid density which may be a function of pressure. The model allows wells to be completed in both fracture and reservoir elements and the $q_w$ in the equation above accounts for injection into the reservoir elements. For example, as shown in FIG. 8, a well may be located at the edge of the reservoir and fracture grids (shown in FIG. 7). An appropriate conversion factor is supplied if units are not consistent.

The velocity $\vec{U}$ is the Darcy velocity relative to the porous material and can be defined by $$\vec{U} = -\frac{K}{\mu}(\nabla p - \rho g \nabla h), \quad (2)$$

where K is a tensor permeability, $\mu$ is the viscosity which may be function of pressure, p is fluid pressure, and $\rho g \nabla h$ is a gravitational term.

The geomechanical variables included in the fluid flow equations highlight the coupling between the flow and deformation models (the definitions of some geomechanical terms are described in Section 6.3.2 below).

Temperature-dependent water properties may be entered in different ways for computations involving temperature changes. The water properties may be entered as functions of both pressure (P) and temperature (T) for the fully coupled computations. For iteratively coupled computations, the water properties can be entered as functions of pressure and then modification factors are used for the temperature effects. The treatment for temperature dependent properties is explained in more detail in Section 6.3.4.

The thermal behavior of the fluids also can be modeled by modifying the fluid properties using modification factors (described in Section 6.3.4.3 below).

6.3.1.1 Multiphase Porous Flow

The reservoir model allows for several phase behavior models ranging from single phase to black-oil to fugacity-based compositions. Darcy flow may be modeled for aqueous phases, nonaqueous liquid phases, and nonaqueous vapor phases and no components. Any phase behavior models may be used with the porous flow models disclosed herein. The fluid flow equations may be presented in terms of a general compositional formulation. Partial differential equations representing component mass balances for multiphase flow are:

$$\frac{\partial}{\partial t}(\phi N_{ic}) = -\sum_\alpha \nabla x_{ic}^\alpha \rho_\alpha \vec{U}_\alpha + q_{ic}, \quad (3)$$

where $N_{ic}$ is the concentration of component ic per unit pore volume, given by $$N_{ic} = \sum_\alpha x_{ic}^\alpha \rho_\alpha S_\alpha,$$

$X_{ic}^\alpha$ is the mole fraction of component ic in phase $\alpha$, $\rho_\alpha$ is the molar density of phase, and $q_{ic}$ is the molar flow rate of component ic per unit reservoir volume. The velocity of phase $\alpha$ is given by $$U_\alpha = -\frac{Kk_{r\alpha}}{\mu_\alpha}\cdot(\nabla P_\alpha - \gamma_\alpha \nabla D), \quad (4)$$

Phase pressures are defined by $$P_\alpha = P + P_{c\alpha} \quad (5)$$

where $P_{c\alpha}$ is the capillary pressure and P is the reference pressure. The reference pressure is used for PVT calculations, well calculations, and geomechanical calculations. The reference pressure is the nonaqueous phase pressure for two-phase models, and the nonaqueous liquid phase pressure for three-phase models.

The porosity is defined as $$\phi = \phi_o[1 + c_r(P - P_o)] \quad (6)$$

for porous flow models where $\phi_o$, $c_r$, and the initial pressure $P_o$ are functions of location.

For computations that include the geomechanical model, the porosity relative to the initial undeformed bulk volume is given by Equation 15, where it is seen that $c_r$ can be related to the Biot constant for porosity.

6.3.1.2 Non-Darcy Flow

In certain examples, non-Darcy flow may be modeled using the Forschheimer equation to modify the relationship between the pressure gradient and the fluid velocity. In other example, non-Darcy flow is modeled by specifying a general relationship between fluid velocity and pressure gradient.

The Forschheimer equation for the non-Darcy velocity (which would replace Equation 2 above), for systems that involve 3-D, multiphase flow in anisotropic media, is given by:

$$-\frac{k_{r\alpha}}{\mu_\alpha} K \vec{\nabla} p_\alpha = \left(1 + \beta_K \rho_\alpha \frac{k_{r\alpha}}{\mu_\alpha} \|\vec{v}_\alpha\|_2\right) \vec{v}_\alpha, \quad (7)$$

where $\mu_\alpha$ is the viscosity of phase $\alpha$, K is the permeability tensor, $k_{r\alpha}$ is the relative permeability of phase $\alpha$, $v_\alpha$ is the Darcy velocity of phase $\alpha$, the expression $\|\ldots\|_2$ is the $L_2$-norm defined by $\|\vec{u}\|_2 = \sqrt{u_x^2 + u_y^2 + u_z^2}$, and the parameter $\beta_k$ is a non-Darcy coefficient. Parameter $\beta_k$ may vary throughout the reservoir, therefore, a value for $\beta_k$ may be entered for each grid block. The non-Darcy coefficient $\beta_k$ is related to the inverse of the transition constant, i.e. $\beta_k = 1/\Gamma$. See Barree et al., "Beyond Beta Factors, A Complete Model for Darcy, Forchheimer, and Trans-Forschheimer Flow in Porous Media," SPE 89325, SPE annual Technical Conference and Exhibition, Houston, Tex., Sep. 26-29, 2004. The Reynolds number for phase is given by the equation $$N_{re}^\alpha = \beta_k \rho_\alpha \frac{k_{r\alpha}}{\mu_\alpha} \|\vec{v}_\alpha\|_2. \quad (8)$$

The units of the terms in Equation 8 should be chosen such that the result is dimensionless. After combining Equations 7 and 8, the Forschheimer equation becomes $$\vec{v}_\alpha = -\frac{k_{r\alpha}}{\mu_\alpha}(1 + N_{re}^\alpha)^{-1} K \vec{\nabla} p_\alpha, \quad (9)$$

where non-Darcy flow is expressed as a phase-dependent, permeability modification function that varies with the Reynolds number for that phase. This is different from the standard permeability modification function, because this non-Darcy formulation has separate values for each phase.

In some cases, the Forschheimer equation does not provide an adequate approximation for non-Darcy flow. Modification functions of the following form can be used to approximate non-Darcy flow:

$$\vec{v}_\alpha = -\frac{k_{r\alpha}}{\mu_\alpha} f_\alpha(N_{re}^\alpha) K \vec{\nabla} p_\alpha, \quad (9A)$$

Modification functions can be constructed which satisfy the constraints $f_\alpha(N_{re}^\alpha) \leq 1.0$ and $f_\alpha(0) = 1.0$. For the standard Forschheimer equation, the following function can be specified:

$$f_\alpha(N_{re}^\alpha) = (1 + N_{re}^\alpha)^{-1}, \quad (9B)$$

For an extended Forschheimer equation, the following functions can be specified:

$$f_\alpha(N_{re}^\alpha) = K_{ratio} + \frac{1 - K_{ratio}}{1 + N_{re}^\alpha}, \quad (9C)$$

Equation 3 in J. L. Miskimins, et al., "Non-Darcy Flow in Hydraulic Fractures: Does It Really Matter?" SPE paper 96389, SPE annual Technical Conference and Exhibition, Dallas, Tex., Oct. 9-12, 2005, is another form of a non-Darcy formulation which is applicable to the methods disclosed herein.

6.3.1.3 Computation in the Reservoir Model

Computation of the reservoir model is on the 3D grid (which is the grid used for the geomechanical model). The 3D reservoir grid can include porous flow calculations. The fluid velocity terms are computed for flow between reservoir cells as well as for flow between reservoir cells and fracture cells. A primary variable for the porous flow equations can be the fluid pressure or the fluid composition, which can be evaluated at the center of each hexahedral element (cell-based). In certain computations, a multi-point flux algorithm is used for the unstructured reservoir flow computations so the resulting computational stencil is 27-point for general hexahedral elements of a 3D grid when eight elements share a common corner.

6.3.2 Geomechanical Model 6.3.2.1 Poroelastic Materials

A linear relationship (small strain) is used for the strain-displacement relations. The coupled flow/displacement model relating stress, strain, temperature, and pore pressures is based upon a Biot poroelastic theory. The equilibrium equation is based upon total stresses and assumes quasi-static equilibrium.

The poroelastic equations are formulated in terms of total stresses, bulk strains, temperatures, and pore pressures. The total stress is defined by the average tractions that one would observe on a planar section of the reservoir where the planar section includes loads carried by the solid and pore pressures from the fluid. The bulk strains are the strains that one would observe from a strain gauge if it were attached to the deforming porous material.

The system of equations for the linear poroelastic displacements include the strain-displacement equation $$\varepsilon_{ij} = \frac{1}{2}(u_{i,j} + u_{j,i}), \quad (10)$$

where the commas imply differentiation, $u_i$ is the displacement in the i-direction $\epsilon_{ij}$ is the bulk strain of the porous material, and expansion corresponds to positive strains. The total stresses satisfy the equilibrium equations $$\sigma_{ij,j} + f_i = 0 \quad (11)$$

where the stress tensor is symmetric, and the gravity term $f_i$ is a function of the solid density, fluid densities, and porosity. Traction or displacement boundary conditions can be specified in all three directions at all six boundaries of the three-dimensional grid on which the model is computed.

When differences in temperature are not taken into account, the constitutive equations relating total stresses, bulk strains, and pore pressure are $$\sigma_{ij} = \sigma_{ij}^o + \frac{E}{1+\nu}\left(\varepsilon_{ij} + \frac{\nu}{1-2\nu}\varepsilon_{kk}\delta_{ij}\right) - \alpha(p - p_o)\delta_{ij}, \quad (12)$$

where tension is positive, the repeated index kk implies summation, $\sigma_{ij}^o$ is the initial in-situ stress, $p_o$ is the initial pressure, E is the elastic modulus, $\nu$ is Poisson's ratio, $\alpha$ is Biot's constant in stress/strain equations, $\delta_{ij}$ is 1 when i=j and 0 when i≠j. It can be assumed that the strains are zero when $\sigma_{ij} = \sigma_{ij}^o$.

In the examples where differences in temperature are taken into account, the constitutive equations are:

$$\sigma_{ij} = \sigma_{ij}^o + \frac{E}{1+v}\left(\varepsilon_{ij} + \frac{v}{1-2v}\varepsilon_{kk}\delta_{ij}\right) - \alpha(p-p_o)\delta_{ij} - \alpha_T K(T-T_o)\delta_{ij}, \quad (13)$$

where $\alpha_\tau$ is the thermal volumetric expansion coefficient for stress/strain equations, and K is the elastic bulk modulus. The pressure $p_o$ is the initial pore pressure and $T_o$ is the initial temperature.

If the stress and pressure terms are combined to form $\sigma_{ij}^e = \sigma_{ij} + \alpha p \delta_{ij}$, then the equation becomes a standard thermal linear elastic constitutive equation where the stresses have been replaced by the effective stresses $\sigma_{ij}^e$. If the initial in-situ stresses and initial pore pressure are zero, the equation then takes the standard form $$\sigma_{ij}^e = \frac{E}{1+v}\left(\varepsilon_{ij} + \frac{v}{1-2v}\varepsilon_{kk}\delta_{ij}\right) - \alpha_T K(T-T_o)\delta_{ij}, \quad (14)$$

The relationship between the porosity (relative to the undeformed bulk volume) and the strains and fluid pressure (when differences in temperature are not taken into account) is given by:

$$\phi = \phi_o + \alpha\varepsilon_{ii} + \frac{1}{M}(p - p_o), \quad (15)$$

where Equation 15 assumes that the initial strains are zero, $\phi_o$ is the initial porosity, and $M^{-1}$ is Biot's constant for pore pressure in porosity equations.

When differences in temperature and deposition fraction are taken into account, the porosity relative to the undeformed bulk volume is defined as:

$$\phi = \phi_o + \alpha(\varepsilon_v - \varepsilon_v^o) + \frac{1}{M}(P - P_o) - \alpha_V(T - T_o) - \sigma, \quad (16)$$

where, $\alpha$ and $M^{-1}$ are Biot constants, P is the phase pressure (for multiphase flow), $\alpha_v$ is the thermal volumetric expansion coefficient for porosity, and $\sigma$ is the deposition fraction (the volume fraction of solid waste deposited per bulk volume, for example, of a grid element in a computation). Solid waste can be deposited within pores as waste moves through the reservoir, and there can be reductions in porosity and permeability as the waste deposition builds up in pore spaces. The porosity in a computation grid element can be a function of fluid pressure, temperature, and deformations, while the amount of porosity reduction due to deposition of solids can be set equal to $\sigma$.

For an isotropic material, the six poroelastic material parameters: E, v, $\alpha$, and $M^{-1}$, $\alpha_\tau$, and $\alpha_v$, are determined before applying the geomechanical equations to the modeling of a geomechanical reservoir system.

In certain examples, the reservoir permeabilities may be expressed as an initial directional permeability ($K_{abs}$) multiplied by a permeability multiplier f for the permeability at every point and for every time step:

$$K = K_{abs} \times f$$

where f is as function of one or more other parameters, such as the fluid pressure, total stresses, bulk volumetric strain, pore pressure, initial reference pressure, principal stresses, effective plastic strain, current porosity, initial porosity, and deposition fraction.

6.3.2.2 Poroplastic Materials

A poroplastic material exhibits nonlinear behavior, in that it may undergo permanent (i.e., plastic) volumetric strains, and hence, porosity changes. Large fluid pressures can cause the poroplastic material to yield. As a result, geomechanical computations for a poroplastic material may predict large sudden changes in fluid porosities. These large sudden changes in porosity can cause significant stability problems and also produce negative fluid pressures. The negative pressures normally arise when the fluid compressibility is low, the permeability is low, and the porosity expansion is sudden and large. The equations for a poroelastic material discussed in Section 6.3.2.1 above are applicable to poroplastic materials also. However, the porosity is modified to account for the changes in porosity that may be predicted for poroplastic materials.

In certain examples, an equation is used to damp sudden porosity changes in order to improve the numerical stability of the computations and to reduce the frequency of encountering negative pressures. In these computations, the porosity in the reservoir model is defined as a fluid porosity ($\phi_{fluid}$), and is treated as different from the porosity in the geomechanical model ($\phi_{geomech}$). The relationship between fluid porosities and geomechanical porosities would be governed by the following damping equation during the computations:

$$\tau \frac{\partial \varphi_{fluid}}{\partial t} = \varphi_{geomech} - \varphi_{fluid}. \quad (17)$$

The fluid porosity ($\phi_{fluid}$) is computed using Equation 17 and used in the fluid flow equations, while the geomechanical porosity ($\phi_{geomech}$) is computed in the geomechanical model, and $\tau$ is a prescribed time constant. After a step change in ($\phi_{geomech}$), the relative difference between $\phi_{fluid}$ and $\phi_{geomech}$ is less than 1% after a time period of 5$\tau$. The value of $\tau$ can be chosen so that the computations are stable and can be chosen to be as short a time interval as possible, for example, by setting $\tau$ to a value that is shorter than the time frame of a time step in the computation or the total time of the computation. By way of example, if a computation is expected to last several days, then $\tau$ can be on the order of minute; if a computation is expected to last a few minutes, then $\tau$ can be on the order of milliseconds. The value of $\tau$ can be set to about one minute for computations on many poroplastic materials. In other examples, the value of $\tau$ can be set to zero. The value of $\tau$ to use for a given computation will be apparent to one skilled in the art.

6.3.2.3 Computation in the Geomechanical Model

Computation of the geomechanical model is on the 3D grid (which is the grid used for the reservoir model). For example, a standard finite element method may be used for the geomechanical equations where stresses are integrated at the eight Gaussian points interior to each element, and fluid pressures are integrated at the center of each element. The discretization produces a 27-point stencil for the displacements when eight elements share a common corner, and there are three displacements at each node. In certain computations, the displacements are the primary variables for the geomechanical equations where the displacements are evaluated at the corners (node-based) of the hexahedral elements.

6.3.3 Fracture Model

Fluid flow in a fracture can be modeled as porous flow between parallel plates, or as laminar flow between parallel plates. For single phase, porous flow in a fracture, the volumetric flow rate per unit length is $$q = -\frac{k_f w}{\mu}(\nabla p - \rho g \nabla h), \quad (18)$$

where w is the total fracture width at the point of interest. The fracture width w is determined at all node locations in the fracture grid. In computation of the fracture model, the volumetric rate through a side of a 2-D fracture element is given by Equation 18 times the length of the side of the fracture element dotted with the unit normal at that side.

In computation of the fracture model, fracture elements are on 2-D quadrilaterals, where flow is calculated through each side of the quadrilateral and fracture openings, or widths, are calculated at the nodes for each element. During the fluid flow portion of a calculation, the two fracture widths on each edge of a quadrilateral are averaged to get the flow rate through that face. Width calculations are also included for the wells to account for productivity enhancements with larger fracture openings.

For laminar flow between parallel plates (channel flow), a lubrication approximation is assumed for flow in the fracture where the volumetric flow rate per unit length is $$\bar{Q} = -\frac{w^3}{12\mu}(\nabla p - \rho g \nabla h), \quad (19)$$

and the computation can be restricted to Newtonian flow. Conservation of mass in the fracture is written as $$\frac{\partial}{\partial t}(\rho w) = -\nabla(\rho \bar{Q}) + q_w - q_L, \quad (20)$$

where $q_w$ accounts for well injection into the fracture elements. The term $q_L$ accounts for the leakoff from the fracture face into the reservoir elements which was included in the fluid velocity term for conservation of mass in the reservoir. The fluid pressure in the fracture controls the flow rate in the fracture as well as acts as a normal traction condition on the 3D grid that includes the geomechanical calculations. The equations above apply to the full fracture width and a multiplier of ½ should be included in the appropriate terms when only half the fracture width is modeled.

Derivatives of the fracture widths in equations (19) and (20) can be included in the fully-expanded Jacobian when using the fully-coupled approach. These terms generally are not included when using an iteratively coupled approach. Including these terms for the fracture width in equations (19) and (20) can enhance the numerical stability of the iterative process.

6.3.3.1 Computation in the Fracture Model

Several fracture grids can be used for computation of separate fractures in a simulation. However, in certain examples, each fracture grid only communicates with wells and reservoir cells and does not communicate with other fracture grids. Flow in a fracture is modeled using a channel-flow approximation (open laminar flow between parallel plates), or using porous flow equations (Darcy or non-Darcy). For porous flow in the fracture, reservoir properties such as porosity, permeability, etc. for the fracture cells can be specified independent of the values specified for the adjoining reservoir cells. Rock tables and PVT tables may also be specified for fracture cells that are different from the tables specified for the adjoining reservoir cells.

In certain examples, the fracture cells are quadrilaterals where each quadrilateral is aligned with faces of the hexahedral cells in the 3-D reservoir model. Each fracture cell communicates with either zero 3-D cells if the fracture cell is outside the 3-D porous solid, one 3-D cell if the fracture cell is at the boundary of the 3-D porous solid, or with two 3-D cells if the fracture cell is interior to the 3-D porous solid. Communication between two 3-D cells is turned off (flow and conduction) in the 3-D grid if two 3-D cells share a common fracture cell.

In certain examples, fractures are connected to injection or production wells by specifying a well path that passes through the fracture nodes. Wells can be completed in both the fracture and the 3-D cells that contain these nodes.

In certain examples, a multi-point flux algorithm is used for the fracture flow computations so the resulting computational stencil is 9-point for general quadrilateral elements when four elements share a common corner. The fracture width is determined from the displacement in the geomechanical equations. The flow rate and mass accumulation term for the fracture are highly sensitive to changes in the fracture width w. The variations in w in Eqs. 19 and 20 are included in the Jacobian for the fully coupled fracture/flow/geomechanics solution or fracture/flow/geomechanics/thermal solution, both for porous flow and channel flow.

Multiphase flow may be modeled by using a relative permeability function as a multiplier in the Equations 18, 19 and 20 above. A typical relative permeability function for channel flow would be linear in saturations. Pressure-dependent permeabilities (for porous flow) and non-Darcy flow may also be included in the volumetric rate Equations 18 and 19 above.

6.3.4 Thermal Model

The thermal model calculates temperature changes that occur when hot or cold fluids are injected into or produced from a reservoir and also calculates conduction from a wellbore that may be circulating hot/cold fluids but is not actually injecting or producing fluids. The temperature calculations may include porous flow and geomechanics but may be configured to not include steam injection. Injected water is assumed to be in a liquid phase.

The thermal model calculates temperature changes that arise due to conduction and convection in the reservoir, hot or cold fluid injection/production at wells, conduction at wells, and thermal and mechanical interactions between the fluids and solid. These mechanisms are combined in a single energy equation that is solved along with the porous flow equations and solid deformation equations. The energy equation is formulated in terms of a Lagrangian-approach for the porous solid and all fluid movement is relative to the movement of the porous solid.

With this type of formulation, the mass of the porous solid is constant when evaluating the energy balance for an element attic reservoir while the mass of fluid changes as fluids flow into and out of the porous solid.

6.3.4.1 Combined Accumulation Term

The combined expressions for energy change in the fluid and solid (when the geomechanical system is included in the computation) is given by:

$$\dot{u}_T = \frac{\partial}{\partial t}\left(\varphi \sum_\alpha \rho_\alpha S_\alpha h_\alpha\right) + C_r \dot{T} + \alpha_T K T_o \dot{\varepsilon}_{ii} - (\alpha_V T_o + \varphi_o)\dot{p} + \sigma_{ij}\dot{\varepsilon}_{ij}, \quad (21)$$

where $\phi$ is the porosity with respect to the undeformed bulk volume, $\alpha$ is the phase, $\rho_\alpha$ is the density of phase $S_\alpha$ is the saturation of phase $\alpha$, $h_\alpha$ is the specific enthalpy of phase $\alpha$, $\alpha_\tau$ is the volumetric expansion coefficient in stress/strain equations, K is the permeability, $\alpha_v$ is volumetric expansion coefficient in the porosity equation, and $T_0$ is the fluid temperature. Conduction and convection terms can affect the combined accumulation term. In Equation 21, the approximation is made that the phase pressures are the same, the term $\phi \dot{P}$ is approximated by $\phi_0 \dot{P}$, and the term $C_r$ is $C_r \equiv C_v + \alpha_v^2 M T_0$. The heat capacity $C_v$ is the heat capacity for a porous solid measured at constant pore volume and constant bulk volume. It can be shown that the heat capacity $C_r$ as defined above is the heat capacity at constant fluid pressure and constant bulk volume. Equation 21 is the general formula for the total rate of change of internal energy in an element and is used for the accumulation term when terms including the fluid temperature $T_0$ are considered in the computation and the computation includes both thermal and geomechanical models.

Equation 21 takes on simpler forms if the fluid temperature $T_0$ is considered in the computation.

For computations that include thermal and geomechanical models and terms including the fluid temperature $T_0$ and $\phi_0 \dot{P}$ are not considered in the computation, the simplified expression is $$\dot{u}_T = \frac{\partial}{\partial t}\left(\varphi \sum_\alpha \rho_\alpha S_\alpha h_\alpha\right) + C_r \dot{T} + \sigma_{ij}\dot{\varepsilon}_{ij}, \quad (22)$$

For computations that include the thermal model, but do not include the geomechanical model, the accumulation term is:

$$\dot{u}_T = \frac{\partial}{\partial t}\left[\varphi\left(\sum_\alpha \rho_\alpha S_\alpha h_\alpha - p\right)\right] + C_r \dot{T}, \quad (23)$$

while for computations that include the thermal model, but do not include the geomechanical model, and the fluid internal energy is approximated by the fluid enthalpy, the expression is:

$$\dot{u}_T = \frac{\partial}{\partial t}\left(\varphi \sum_\alpha \rho_\alpha S_\alpha h_\alpha\right) + C_r \dot{T}, \quad (24)$$

6.3.4.2 Energy Equation

The choice of the accumulation term above determines the equations that are included in the final energy conservation equation. The energy equation is expressed as $$\frac{\partial}{\partial t}\left(\varphi \sum_\alpha \rho_\alpha S_\alpha h_\alpha\right) + C_r \dot{T} = \quad (25)$$

$$\nabla \cdot (K_T \nabla T) - \nabla \cdot \left(\sum_\alpha \rho_\alpha h_\alpha \vec{v}_\alpha\right) + \sum_\alpha \rho_\alpha h_\alpha q_\alpha \delta(\vec{x}),$$

where a constant temperature boundary condition is applied at injection wells. Since Equation 25 does not contain any mechanical terms, other than transport, the temperatures in grid blocks should not be affected by the expansion or compression of a fluid phase or solid when the enthalpies are only functions of temperature. However, Equation 25 does still account for heat of vaporization from a liquid to vapor because the latent heat can be included in the difference between the enthalpy of a component in a liquid phase and its corresponding enthalpy in the vapor phase.

If a simulation includes geomechanical calculations and terms including the fluid temperature $T_0$ are considered in the computation, then the general energy equation is given by:

$$\frac{\partial}{\partial t}\left(\varphi \sum_\alpha \rho_\alpha S_\alpha h_\alpha\right) + C_r \dot{T} + \alpha_T K T_o \dot{\varepsilon}_{ii} - (\alpha_V T_o + \varphi_o)\dot{p} = \quad (26)$$

$$\nabla \cdot (K_T \nabla T) - \nabla \cdot \left(\sum_\alpha \rho_\alpha h_\alpha \vec{v}_\alpha\right) + \sum_\alpha \rho_\alpha h_\alpha q_\alpha \delta(\vec{x}),$$

The $\sigma_{ij}\dot{\varepsilon}_{ij}$ term is present on both sides of the energy equation; i.e., in the accumulation term and also as work done on the bulk solid, and consequently $\sigma_{ij}\dot{\varepsilon}_{ij}$ is not included in Equation 26.

6.3.4.3 Modifications to Fluid Densities and Viscosities

There are several options for computing temperature-dependent densities and viscosities for fluids, and the methods available for computing densities and viscosities vary depending on the phase behavior model and the numerical technique that is being used. In certain examples, the fluid properties are computed directly as functions of temperature and pressure. In certain other examples, the fluid properties are computed as a function of the current cell pressures and initial cell temperatures (isothermal flash) and modification functions are used to correct for the differences between the initial cell temperatures and the current cell temperatures.

Fluid properties may be computed directly as a function of temperature and pressure for implicit single phase runs, implicit two-phase runs, and implicit compositional runs. These computations involving the geomechanical model can be iteratively coupled or fully coupled.

The viscosities and densities that are calculated in the black-oil, K-value, and compositional PVT packages may be modified to account for changes in fluid properties due to temperature changes. The initial reservoir temperature and current fluid pressure during a computation may be used to calculate the fluid properties in each of the PVT packages (isothermal flash) and then these properties are modified by multiplying by user-supplied modification factors, i.e., $\mu(p, T)=\mu(p,T_o)\bar{\mu}(T)$ where $\bar{\mu}(T)$ is entered as a table and $\mu(p,T_o)$ is calculated in the PVT package.

For many thermal-geomechanical studies, interest is primarily focused on how temperature affects fluid viscosities and thermal stresses. For these types of applications, either the modification factors or direct calculation of fluid properties may be used, and the results are very similar using both techniques. However, for applications where temperature has a strong effect on densities and/or phase separation, then the direct calculation of fluid properties can be used as functions of temperature and pressure.

6.4 Interrelationship of the Various Models

A system and method can couple the interactions between the different geomechanical reservoir system models, e.g., between porous flow, geomechanical displacements and stresses, and fluid flow and growth for the fracture. For example, the geomechanical solution can influence the porous flow computations through the porosity and permeability terms, and can influence the fracture calculations through the fracture widths and fracture propagation criteria. As another example, the fluid solution in the reservoir can affect the geomechanical calculations through its role in the effective stresses and can influence the fracture calculations by regulating fluid flow between the fracture and reservoir. In yet another example, the fluid solution in the fracture can affect the geomechanical calculations through the normal traction that occurs at the face of the fracture and can affect the flow in the reservoir through leakoff.

6.5 Fracture Propagation Models

A system and method can provide for prediction of fracture growth to investigate how a horizontal or vertical fracture would evolve over time at the boundary of a grid, as discussed in Section 6.5.1 below. In this example, the profile of a fracture and fracture widths are predicted through parameters input into the fracture model.

There is a strong interaction between flow in the fracture and fracture widths, and very small fracture widths may be predicted near a fracture front. Fracture growth is predicted using the geomechanical model, where the fully coupled geomechanical model implicit timestepping for fluid flow is used. In these examples, the evolving profile of a fracture (i.e., fracture propagation) is predicted based on a stress intensity factor or cohesive elements, as discussed in Sections 6.5.2 and 6.5.3 below. Fractures propagating along an edge of the 3-D reservoir grid may be predicted. Two fracture propagation criteria provide for determining when and where the fracture grows. The fracture propagation criteria can serve as a measure of the fracture toughness of the rock. Both fracture propagation criteria use the fluid pressure, stress, and displacement states near the fracture front to decide when the fracture propagates. Propagation is modeled by releasing nodes at the fracture tip that previously had zero displacement constraints. When the displacement at a previously open fracture node becomes negative, it is assumed that the fracture has closed at that point and re-applies the displacement constraint. The closed node has zero strength and can re-open at a later time if the node experiences a tensile force at that node. Section 6.5.4 describes the type of relationship interplay which can occur between these two criteria.

Section 6.5.5 describes a dry zone developing at a fracture tip. Other features of the fracture growth prediction are discussed in Sections 6.5.6 and 6.5.7.

6.5.1 Prescribed Fracture Profiles

The width profile for a fracture in a fracture grid can be prescribed through parameters input into the fracture model. For example, a 2-D fracture may be added to a 3-D reservoir grid by first specifying the layout and properties for the fracture grid, and then by specifying the fracture width at each node in the fracture grid. The values of the fracture widths in the fracture grid can be changed in the transient input data to simulate the effect of a growing fracture.

Figure 9:
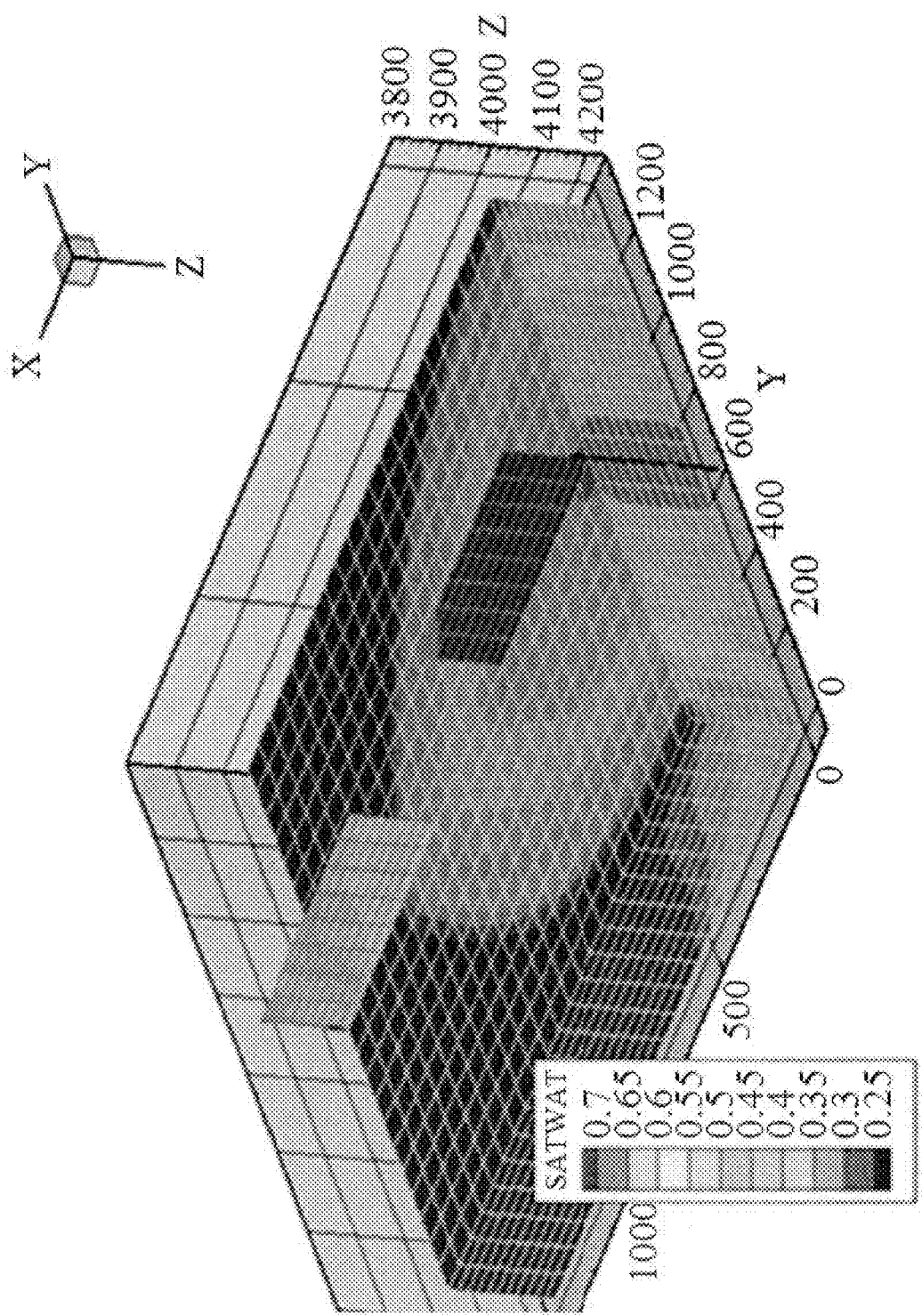
FIG. 9 shows two fractures that have been inserted into a reservoir grid.

FIG. 9 shows two fractures that have been inserted into a reservoir grid. For this grid, the total fracture widths are entered for each node in each fracture grid. However, fracture half-widths should be entered for fractures that are located on the edge of a grid. The fractures in the figure are actually located inside the reservoir grid, but have been offset from the reservoir grid for plotting purposes. FIG. 9 shows a fracture at an injection well and another fracture at the production well. For this case, each fracture cell communicates with two reservoir cells. The communication between reservoir cells that are separated by a fracture cell are set to zero. This involves setting transmissibilities to zero for fluid flow as well as setting conductivities to zero for thermal calculations.

For prescribed fracture profiles, the default fracture width for every node in the fracture grid is set to the user-specified value. The fracture widths can be prescribed individually for each fracture node in a grid. That is, the fracture widths may be specified in the initial data and at various points during the computation (e.g., in transient data sections of the input data), or are contained only in the initial data section the fracture widths are specified as a function of time and location.

One set of flow calculations are used for cells in a fracture grid where the fracture widths are larger than a predetermined threshold value, and another set of flow calculations are used for those cells in the fracture grid where the widths are less than the predetermined threshold value. Cells that have all corner nodes with fracture widths less than the predetermined threshold value are considered closed fracture cells. For these closed fracture cells, the fluid flow between the cells is modeled as porous flow where the permeabilities in the cells are taken from the adjoining reservoir cells and the displacement constraints are applied at the appropriate nodes.

For flow between cells where the fracture widths are greater than the predetermined threshold value (i.e., open fracture cells), either a channel flow model or a porous flow model is used. For the porous flow model, the input fracture permeabilities are used for the flow calculations, where either the fracture permeabilities for all open fracture cells are set to a user-specified default value or a user can specify values of the fracture permeabilities for individual cells. In addition, for this porous flow model, the porosity in each fracture cell and the pore compressibility are set to specified values. For the channel flow model, the porosity is set to 100% for all cells in a fracture grid, and for this case, there is no pore compressibility term.

6.5.2 Stress Intensity Factor

The first propagation option uses a critical fracture opening criterion based upon the stress intensity factor. The critical stress intensity factor is based on the asymptotic stress/strain state at the tip of a fracture. In certain examples, this propagation criterion is limited to linear poroelastic applications.

Figure 10:
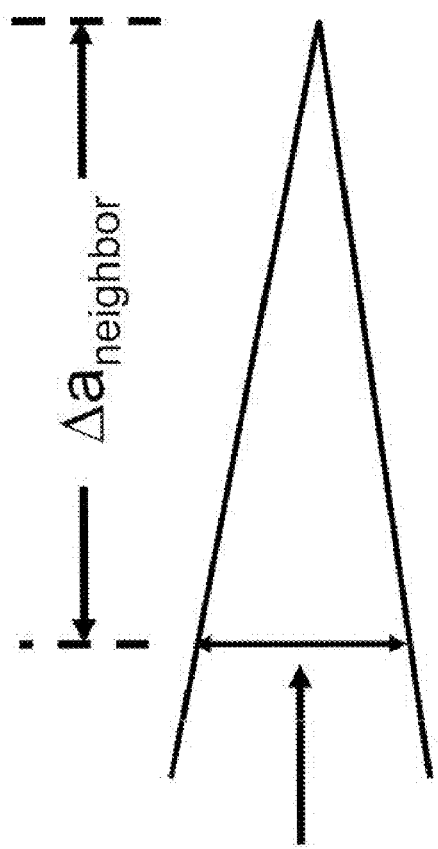
FIG. 10 illustrates the critical fracture opening fracture propagation criterion relative to a fracture tip.

For linear elastic, plane strain conditions at the tip of a fracture under mode I loading conditions, the fracture opening near the tip may be expressed in terms of the mode I stress intensity factor, $K_I$, as $$w(\Delta a) = \frac{4(1-v^2)}{E} K_I \sqrt{\frac{2\Delta a}{\pi}}, \tag{27}$$

where $\Delta a$ is the distance from the fracture tip in the direction normal to the leading edge of the fracture and w is the total fracture width and $K_I$ is a function of the geometry and loading conditions. The $K_{IC}$ fracture propagation option releases nodes at the fracture tip whenever the fluid pressure at the tip of the fracture is large enough to keep the new fracture area open, and the fracture width at a neighboring node exceeds $$w_{neighbor} \geq \frac{4(1-v^2)}{E} K_{IC} \sqrt{\frac{2\Delta a_{neighbor}}{\pi}}, \tag{28}$$

where $\Delta a_{neighbor}$ is the distance from a neighboring node to the node at the fracture tip. FIG. 10 illustrates the critical fracture opening criterion relative to a fracture tip. In this example, only neighboring nodes that share a common side of a quadrilateral with the node that is at the fracture tip are checked in computations employing this fracture propagation model. The computation models a fracture with zero toughness whenever $K_{IC}$ is set to zero.

6.5.3 Cohesive Elements

The second fracture propagation criterion uses quadrilateral cohesive elements to model a cohesion zone at the fracture tip. A cohesive model was used by Hillerborg et al. to simulate crack formation. Hillerborg et al., 1976, Cement and Concrete Research 6: 773-782. Growth in concrete and finite element based cohesive elements have been used in the study of elastic-plastic fracture of metals. Ortiz et al., 1999, Int. J. Num. Methods in Engr., 44:1267-1282. In particular, cohesive elements are based on energy release rates and tensile stresses. This fracture propagation model is used for poroelastic and poroplastic applications.

In some examples, it is assumed that the fracture fluid may flow to the tip of the cohesive zone and that there are tensile forces in the cohesive zone attempting to hold the fracture faces together. Cohesive elements may be used to model strain localization and may also be used for poroplastic calculations. Another advantage of cohesive elements is that they can be used for both fracture creation and growth, while the $K_{IC}$ approach requires that there be a pre-existing fracture or that some other logic be used for fracture creation.

Cohesive elements include a tensile strength and an energy release rate in the calculations at the tip of a propagating hydraulic fracture. This fracture propagation model uses a material's tensile strength and energy release rate to determine when a fracture propagates. It is assumed that the material on the fracture plane obeys a softening equation of the form $$\sigma = \sigma_c \left(1 - \frac{w}{\delta_c}\right), \tag{29}$$

where $\sigma$ is the stress normal to the fracture plane, $\sigma_c$ is the tensile strength, w is the total fracture width, and $\delta_c$ is the critical separation. The equation above assumes that w is increasing.

Figure 11:
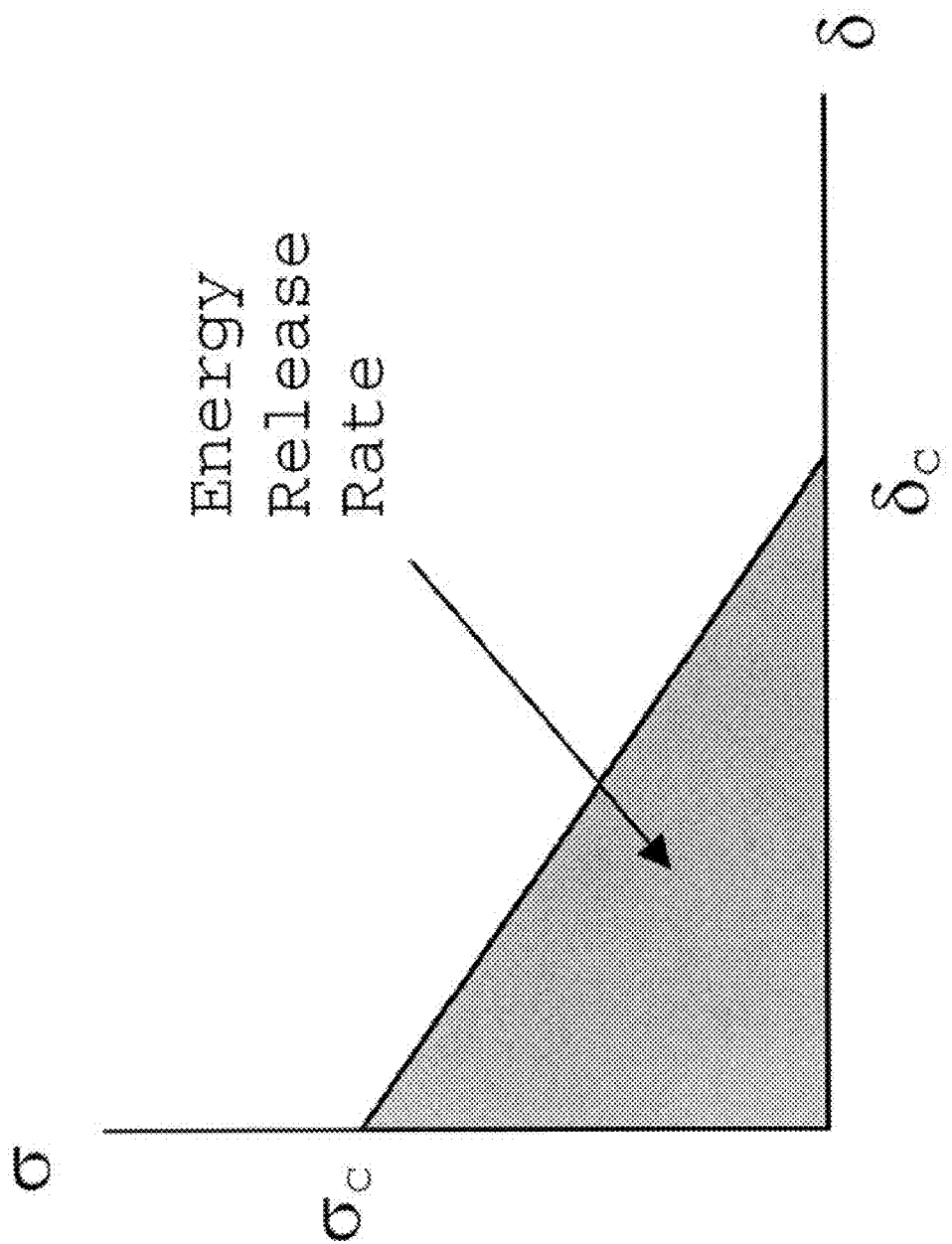
FIG. 11 shows a plot of the relationship between the stress normal to the fracture plane, the critical separation, and the energy release rate.
Figure 12:
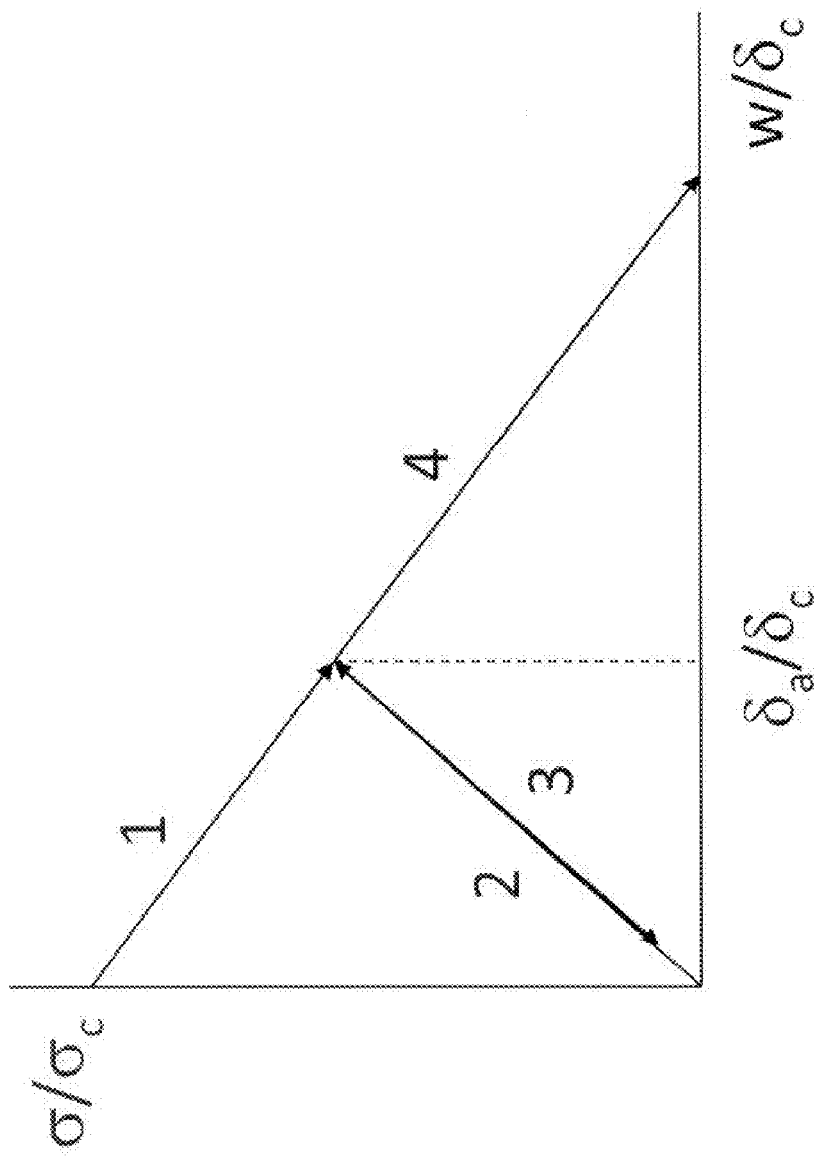
FIG. 12 illustrates a loading/unloading path of a cohesive element.

The relationship between $\sigma_c$, $\delta_c$ and the energy release rate is shown in FIG. 11. The stress/displacement curve follows a different path whenever w decreases. In certain examples, the computation returns the stress/displacement curve towards the origin when w decreases. FIG. 12 shows the loading/unloading path a cohesive element would follow when the fracture width at the node increases from 0 to $\delta_a$ (path 1) and decreases back to 0 (path 2) and then increases back to $\delta_a$ (path 3), and finally grows to total separation at $\delta_c$ (path 4).

Separation begins on the fracture plane when the stress perpendicular to the fracture plane is equal to the tensile strength $\sigma_c$. The material at the interface then begins to weaken as the material separates further and the stress perpendicular to the fracture plane decreases. The tensile stress becomes zero once the fracture separation exceeds the critical value of $\delta_c$. The critical value of $\delta_c$ is determined and is the value where the critical energy release rate satisfies the equation:

$$G_C = \frac{1}{2} \sigma_c \delta_c, \tag{30}$$

Figure 13:
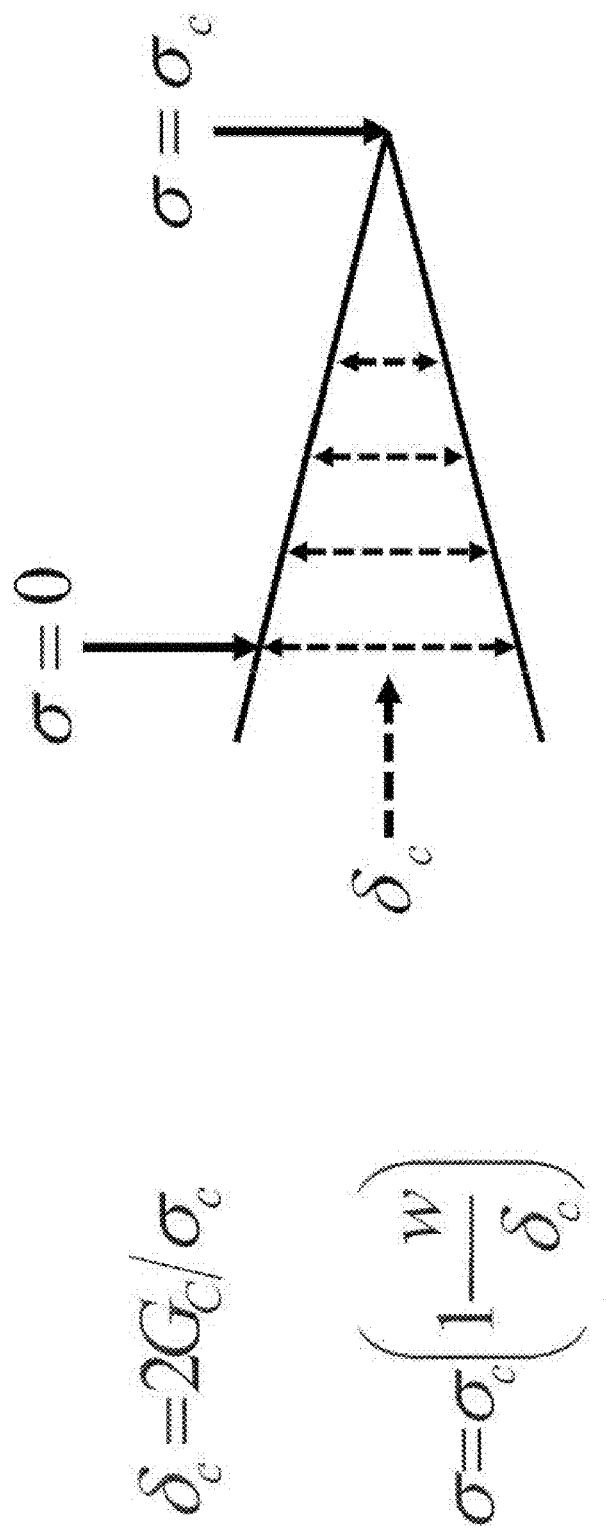
FIG. 13 illustrates the cohesive elements fracture propagation criterion relative to a fracture tip.

FIG. 13 illustrates the cohesive elements fracture propagation criterion relative to a fracture tip.

6.5.4 Relationship Interplay of Stress Intensity Factor and Cohesive Elements

For linear elastic, plane strain, mode I problems, the energy release rate is related to the stress intensity factor by $$G_C = \frac{1-v^2}{E} K_{IC}^2, \tag{31}$$

A critical stress propagation criterion may be implemented by using the cohesive option with a finite value of the tensile stress and a very small value of the energy release rate, but the solution is observed to be strongly grid dependent unless one allows a dry zone to develop at the tip of the fracture or unless one uses a very fine grid that includes the effects of the cohesive zone. In a rigorous implementation of a critical stress criterion, the stress would be evaluated at a fixed distance ahead of the fracture in order to ensure convergence of the algorithm with grid refinement. One can obtain a rough estimate for the size of the cohesive zone by using the asymptotic solution for the crack width for a plane strain, mode I fracture where $$w(r) = \frac{8(1-v^2) K_{IC}}{E} \sqrt{\frac{r}{2\pi}}, \tag{32}$$

and r is the distance from the tip. If Eq. 32 equation is combined with Eqs. 30 and 31, then the length of the cohesive zone can be estimated by the equation $$r_c = \frac{\pi}{8} \left(\frac{K_{IC}}{\sigma_c}\right)^2, \tag{33}$$

which is the same size as the plastic zone in the Dugdale-Barenblatt model (strip yield model with constant tensile stress ahead of fracture). Equation 33 is a rough estimate of the size of the cohesive zone because it is based upon the asymptotic solution for a fracture that does not contain a cohesive zone. In addition, the estimate may not be accurate if the asymptotic solution is not valid over the range of interest. Simulation results may show that the size of the cohesive zone should be estimated by a different equation. For example, as demonstrated in Section 6.1.4 in connection with a specific example, the size of the cohesive zone can be estimated by the equation $(\pi/4)(K_{IC}/\sigma_c)^2$, which is a factor of two larger than Equation 33.

6.5.5 Dry Zone at a Fracture Tip

A fracture may propagate quicker than the fracture fluid can fill up new fracture elements that are created at the tip of a propagating fracture. This can cause negative pressures to develop at the tip of a propagating fracture if the fracture fluid has to completely fill the tip. A dry zone may occur at the fracture tip in a physical application because the fracture is running ahead of the viscous fluid, or a dry zone may also arise because of the numerical technique that is used for fracture propagation. A dry zone develops as an artifact of the methods disclosed herein, e.g., when nodes are released during a timestep and the timesteps in the simulation are too small for the fluid to fill up the newly created fracture cells. A dry zone at the fracture tip may be necessary for some applications depending on the fracture fluid viscosity and fracture width, see Yew et al., 1993, SPE 22875, SPE Production & Facilities, 8: 171-177.

Figure 14:
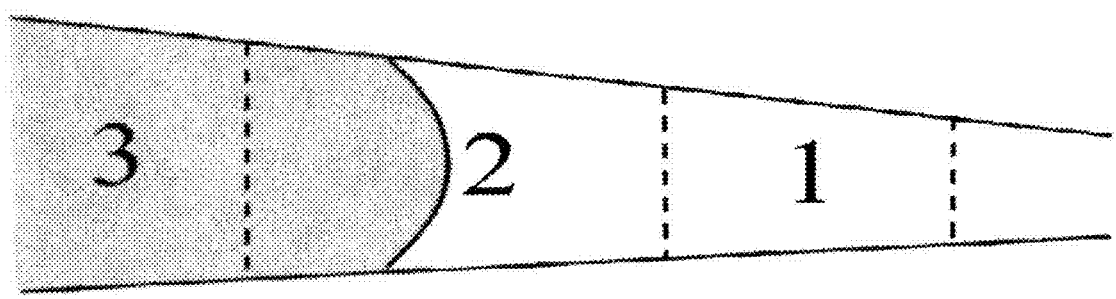
FIG. 14 shows a schematic of partially saturated grid elements, where the fluid is propagating from left-to-right and the fracture width is narrowing from left-to-right.

In order to allow dry zones to develop, a system and method can allow elements in the fracture to be partially saturated with fluid. A schematic of partially saturated elements is shown in FIG. 14, where the fluid is propagating from left-to-right and the fracture width is narrowing from left-to-right. The fracture fluid is the shaded region in FIG. 14 and the dashed lines represent the boundaries between each fracture cell. Element number 3 is fully saturated with fluid while element 2 is partially saturated and element 1 has no fluid. In an example, the fracture fluid is allowed to flow from cell 3 to cell 2 in FIG. 14, but no fracture fluid is allowed to flow from cell 2 to cell 1 until cell 2 fills with fluid. Even though fracture fluid is not allowed to flow directly from cell 2 to cell 1 in this example, reservoir fluid can still flow into cell 1 if the reservoir has a nonzero permeability. During the computation in this specific example, the fluid volume in the cell is the variable for cells 1 and 2, while the fluid pressure is the variable for cell 3.

The fluid pressure in a partially saturated element is prescribed to have a user-specified value until the cell fills completely with fluid. Typical values for the prescribed pressures are the initial fluid pressure and zero pressure. However, the pressure in the dry zone can be chosen to be some value less than the pressure in the surrounding reservoir cells. The partially saturated cells are included in the mass conservation equations. As an example, primary variables for these cells are the fluid volumes in the cells rather than the fluid pressures. A cell may become fully saturated by having additional fluid flow into the cell or by having the fracture width decrease to the point that the fracture volume is equal to the fluid volume. During a simulation, a dry zone may develop as a natural part of the solution process and the implementation of the method does not require any pre-determined specifications for the dry zone other than the value that is used for the fluid pressure in the dry zone.

6.5.6 Geomechanical Fracture Growth and Porous Flow in the Fracture

Computation on the geomechanical model may be used to determine the fracture profile and fracture widths while still modeling porous flow in the fracture. This option is used for fractures that are located at the edge of grid, and all fracture widths for the fracture grid that are entered during a run are fracture half-widths.

Values of initial fracture half-widths may be entered in the initial data section of the input dataset, where nonzero values for the fracture halfwidths are entered for cells near the well in order to set up a small initial fracture which then grows with time. The stress intensity factor or energy release rate may be used to compute the evolving fracture profile during a run.

Also, fracture half-widths may be computed based on the computations on the geomechanical model. These geomechanical fracture half-widths are used for the fluid flow and pore volume calculations if they are larger than the values specified for the initial fracture half-widths. Otherwise, the input values for the fracture half-widths are used for the flow and pore volume calculations in the open fracture cells.

In this example, closed fracture cells are identified as those cells where all the corner half-widths are less than a predetermined threshold value of the fracture widths. For closed fracture cells, the porous flow equations are used in the computation, but the displacement constraints are applied at the appropriate nodes when a bulk volume of a cell and the transmissibilities between cells are computed. In addition, the reservoir permeabilities in the neighboring reservoir cells are used for the closed fracture cells in the fracture grid.

6.5.7 Geomechanical Fracture Growth and Channel Flow in the Fracture

Computation on the geomechanical model may be performed with channel flow to predict the fracture profile. For this option, fluid flow in the open fracture cells is modeled as laminar flow between parallel plates and the assumption of zero fracture widths no flow for closed fracture cells is imposed. No permeabilities or porosities are used in the fracture grid in this model. This option also allows a semi-dry zone to develop near the leading edge of a fracture. This option is used for fractures that are located at the edge of grid, and all fracture widths for the fracture grid that are entered during a run are fracture half-widths.

Values of initial fracture halfwidths may be entered in the initial data section of the input dataset, where nonzero values for the fracture half-widths are entered for cells near the well in order to setup a small initial fracture which then grows with time. The stress intensity factor or energy release rate may be used to compute the evolving fracture profile during a run.

Also, fracture half-widths may be computed based on the computations on the geomechanical model. These geomechanical fracture half-widths are used for the fluid flow and pore volume calculations if they are larger than the values specified for the initial fracture half-widths. Otherwise, the input values for the fracture half-widths are used for the flow and bulk volume calculations in the open fracture cells.

In this example, closed fracture cells are identified as those cells where all the corner half-widths are less than a predetermined threshold value of the fracture widths. No calculations are performed for closed fracture cells. That is, it is assumed that closed fracture cells have zero bulk volume and no flow.

6.6 Implementation of the Fracturing Prediction Method

The Jacobian for the full system of equations for the models included in the computation is fully expanded and all equations are solved simultaneously in the linear solver. The various mechanisms are coupled using either one-way, explicitly, iteratively, or fully coupled techniques. More taxing problems (e.g., sanding, cavity completions, and hydraulic fracturing) use the most stable coupling technique, and the fully coupled solution technique is used throughout the hydraulic fracturing work described herein.

The equations discussed in the previous sections can be implemented in a single program and the program computes an implicit solution for all the equations, i.e., a backward-Euler technique can be used to approximate the temporal (i.e., time) derivatives and all primary variables and coefficients in the equations are evaluated at the end of the time step. Non-limiting examples of primary variables are the fluid pressures in the reservoir, the displacements in the reservoir and at the boundary of the reservoir (if unconstrained), the fluid pressures in the fracture (or fluid volumes in the fracture if partially saturated), and the well pressure. The system of equations can be solved using a Newton-Raphson technique where the fully-expanded Jacobian is generated for the entire system of equations and incremental corrections are found using a linear solver that includes all the solution variables.

Fracture propagation can be simulated by computing flow through an existing 2D fracture, and computing the leakoff to the adjoining 3D reservoir along with computing the effective stresses and displacements that arise in the adjoining 3D reservoir. Fracture propagation criteria are then combined with the stress and displacement states at the fracture front to decide when the fracture front propagates. Propagation is modeled by releasing nodes at the fracture tip that previously had zero displacement constraints. When the displacement at a previously open fracture node becomes negative, the program assumes the fracture has closed at that point and re-applies the displacement constraint. The closed node can re-open at a later time if the node experiences a tensile force. Fracture propagation predictions may be undertaken for fractures that are at the edge of a 3D grid.

Certain examples discussed herein allow a fracture to propagate across multiple grid blocks during a single timestep. Each timestep begins with the fracture configuration, fluid state, and geomechanical state from the previous timestep. The computation then iterates to a converged solution for the conservation of mass and stress equilibrium equations assuming the fracture does not propagate. The computation allows the fracture widths to change during this set of iterations, but does not allow the fracture front to move. After the computation has converged, the fracture propagation criteria is used for all nodes in the fracture grid to see if closed nodes should open or if open nodes should close. If the fracture front changes, then the computation repeats the iterations on the mass conservation equations and the stress equilibrium equations until a new converged solution is obtained. Once a new converged solution is obtained, the propagation criteria are checked again to see if there are any further changes in the fracture front. This sequence of iterations may be continued on the equations and checking propagation criteria for a number of times, or until no further propagation is seen for a timestep before moving on to the next timestep.

A fracture may grow or contract during a time step. The solution to the fully-expanded Jacobian can be computed using a three-step process which takes into account such changes:

Step 1. The first step assumes that the fracture boundaries are fixed and the system of equations is solved for the given fracture configuration (a fracture may open wider or become narrower, but the edges of the fracture do not change). The system of equations is solved using a Newton-Raphson technique where the Jacobian is generated for the entire system of equations and incremental corrections are found using a linear solver that includes all the solution variables. The program generates the Jacobian for the full system in order to increase robustness and to preserve second order convergence for the nonlinear iterations.

For example, derivatives of the fracture widths in equations (19) and (20) can be included in the fully-expanded systems of equations when using the fully-coupled approach. These terms generally are not included in conventional methods which use an iteratively-coupled approach. Including these derivatives of the fracture width in equations (19) and (20) can enhance the numerical stability of the iterative process.

Step 2. After the solution has converged for the given fracture geometry, the program then uses one of the propagation criteria described above to determine if the fracture edges move and checks the displacement solution to determine if portions of the fracture surface have closed. If no changes are detected in the boundaries, then the program goes on to the next time step; otherwise, the program proceeds to step 3 and then starts over at step 1 with the new fracture boundaries. This process continues until no additional changes occur in the fracture boundaries.

Step 3. If the propagation criteria are exceeded and the fracture grows then displacement constraints are removed at the appropriate nodes on the boundary and the fracture is allowed to open at those points and the fluid pressure in the fracture becomes a traction condition at the newly created fracture surfaces. If the fracture shrinks (i.e., the surface displacements predict a negative fracture width) then the displacement constraints are re-applied at the appropriate nodes.

FIG. 5 illustrates an implementation of this approach, where fracture propagation growth models are used to predict the fracture profile, Step 1, Step 2 and Step 3 are used in the implementation of the fracturing prediction method, and a dry zone is modeled.

The implementation of the methods may limit the amount of crack propagation that can occur at the end of each set of nonlinear iterations, so a single time step may take several nonlinear iterations if the fracture propagates across a large number of elements during that time step. Much of the CPU time for the computations can be spent in finding the solution to the linear system of equations that is generated during each nonlinear iteration.

6.7 Examples of Apparatus and Computer-Program Implementations

The methods disclosed herein can be implemented using an apparatus, e.g., a computer system, such as the computer system described in this section, according to the following programs and methods. Such a computer system can also store and manipulate the data indicative of physical properties associated with a geomechanical reservoir system, the fully-expanded Jacobian for the full system of equations for the models included in the computation, the solution to the fully-expanded Jacobian, the generated fracturing predictions, or measurements that can be used by a computer system implemented with the analytical methods described herein. The systems and methods may be implemented on various types of computer architectures, such as for example on a single general purpose computer, or a parallel processing computer system, or a workstation, or on a networked system (e.g., a client-server configuration such as shown in FIG. 15).

Figure 15:
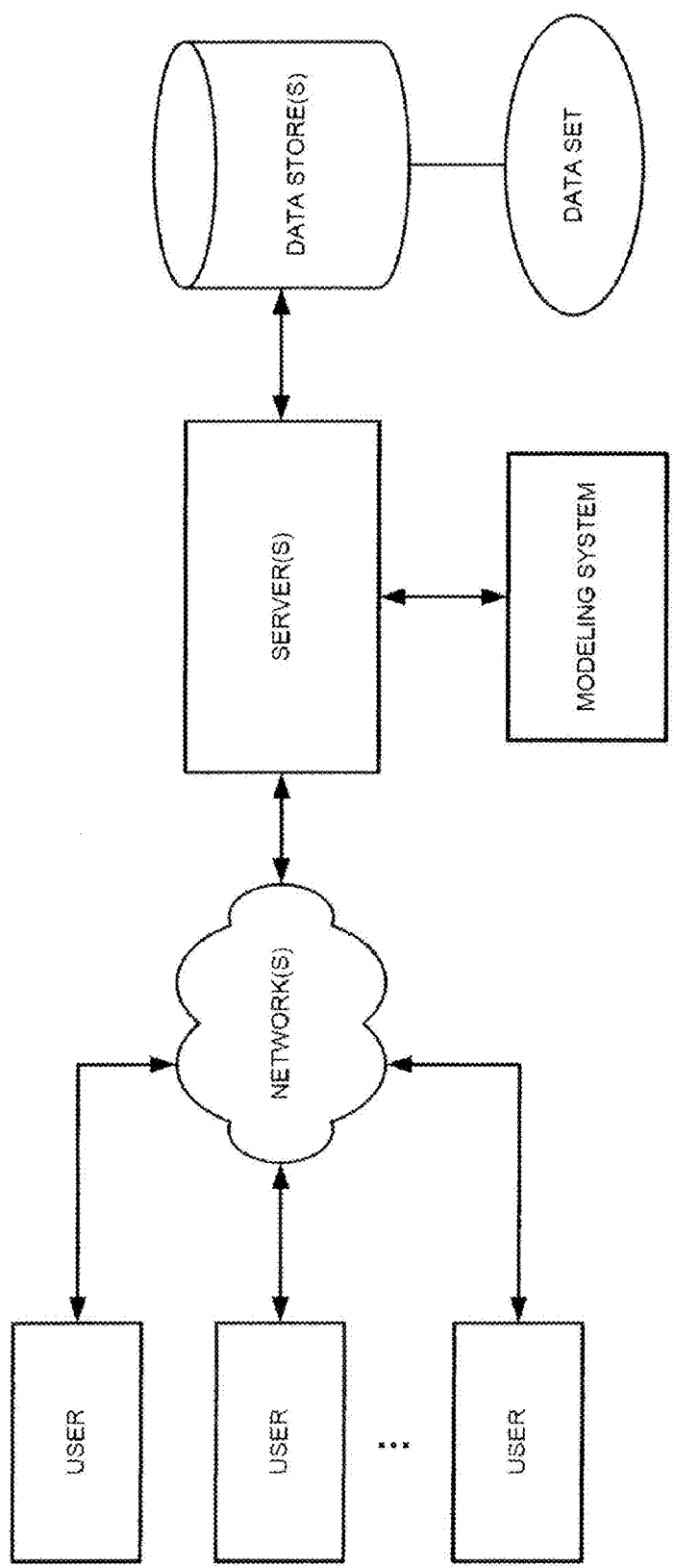
FIG. 15 illustrates an example of a computer system for implementing the modeling methods disclosed herein.

As shown in FIG. 15, the modeling computer system to implement one or more methods and systems disclosed herein can be linked to a network link which can be, e.g., part of a local area network ("LAN") to other, local computer systems and/or part of a wide area network ("WAN"), such as the Internet, that is connected to other, remote computer systems. The systems and methods may include data signals conveyed via networks (e.g., local area network, wide area network, Internet, combinations thereof, etc.), fiber optic medium, carrier waves, wireless networks, etc. for communication with one or more data processing devices. The data signals can carry any or all of the data disclosed herein that is provided to or from a device.

The modeling system comprises any methods of the described herein. For example, a software component can include programs that cause one or more processors to implement steps of accepting a plurality of parameters indicative of physical properties associated with the geomechanical reservoir system, and/or the generated fracturing predictions and storing the parameters indicative of physical properties associated with the geomechanical reservoir system, and/or the generated fracturing predictions in the memory. For example, the system can accept commands for receiving parameters indicative of physical properties associated with the geomechanical reservoir system, and/or parameters of a generated fracturing prediction, that are manually entered by a user (e.g., by means of the user interface). The programs can cause the system to retrieve parameters indicative of physical properties associated with the geomechanical reservoir system, and/or parameters of a generated fracturing prediction, from a data store (e.g., a database). Such a data store can be stored on a mass storage (e.g., a hard drive) or other computer readable medium and loaded into the memory of the computer, or the data store can be accessed by the computer system by means of the network.

An embodiment of the present disclosure provides a computer-readable medium storing a computer program executable by a computer for performing the steps of any of the methods disclosed herein. A computer program product can be provided for use in conjunction with a computer having one or more memory units and one or more processor units, the computer program product comprising a computer readable storage medium having a computer program mechanism encoded thereon, wherein the computer program mechanism can be loaded into the one or more memory units of the computer and cause the one or more processor units of the computer to execute various steps various steps of the processes of the block diagram shown in FIG. 5.

7. NUMERICAL RESULTS

In this section, examples of processing results are discussed.

7.1 Fracture Prediction Results

These examples demonstrate different aspects of the program and illustrate validation of the program against analytical solutions. In particular, the examples demonstrate the predictive capability of the geomechanical reservoir system modeling methods described herein. The examples also highlight the differences when applying the two fracture propagation criteria, and illustrate when a dry zone can be expected to develop at the fracture tip. The examples also allow the comparison of the fracturing predictions obtained using the geomechanical reservoir system modeling methods with analytic solutions, which validates the fracture propagation algorithms used.

The systems and methods also can be capable of modeling compositional multiphase fluid injection with flow between the fractures and reservoir. However, the numerical results presented in this section assume slightly compressible single phase flow in a single fracture with no leakoff into the reservoir to facilitate comparisons with analytical solutions and to focus on the fracture propagation and dry zone aspects of the program. The numerical results presented in this section are restricted to slightly compressible, isothermal, single phase fluids.

The fluid that is used in Sections 7.1.1, 7.1.2, and 7.1.3 below is slightly compressible and the density can be written as $\rho_o(1+c_w(P-P_r))$ where the compressibility $c_w$ is 3.0E-6 $psi^{-1}$ and the reference pressure $P_r$ is 14.7 psi. The results in Section 7.1.1 are for a constant rate of injection into a plane strain fracture where the fluid viscosity is very low. For this problem, fracture growth is controlled by the stress intensity factor or by the energy release rate and tensile stress at the fracture tip. Both fracture propagation models are applied in the computation in Section 7.1.1 to demonstrate the differences between the two propagation models. The results in Section 7.1.2 are for a computation similar to Section 7.1.1, but a high viscosity fluid is used. Section 7.1.2 shows that a dry zone develops at the tip of a fracture when there is significant pressure drop in the fracture. The results in Section 7.1.3 are for a quarter of a penny-shaped fracture which demonstrates the ability of the program to model growth in both directions in the fracture plane. The computation in Section 7.1.3 also uses a low viscosity fluid so the results can be compared to analytical results. In Sections 7.1.1, 7.1.2, and 7.1.3, values of $\alpha$ and $M^{-1}$ equal to 1.0 and 0.0, respectively, are used in the geomechanical model.

7.1.1 Plane Strain Fracture with Low Viscosity Fluid

Figure 16:
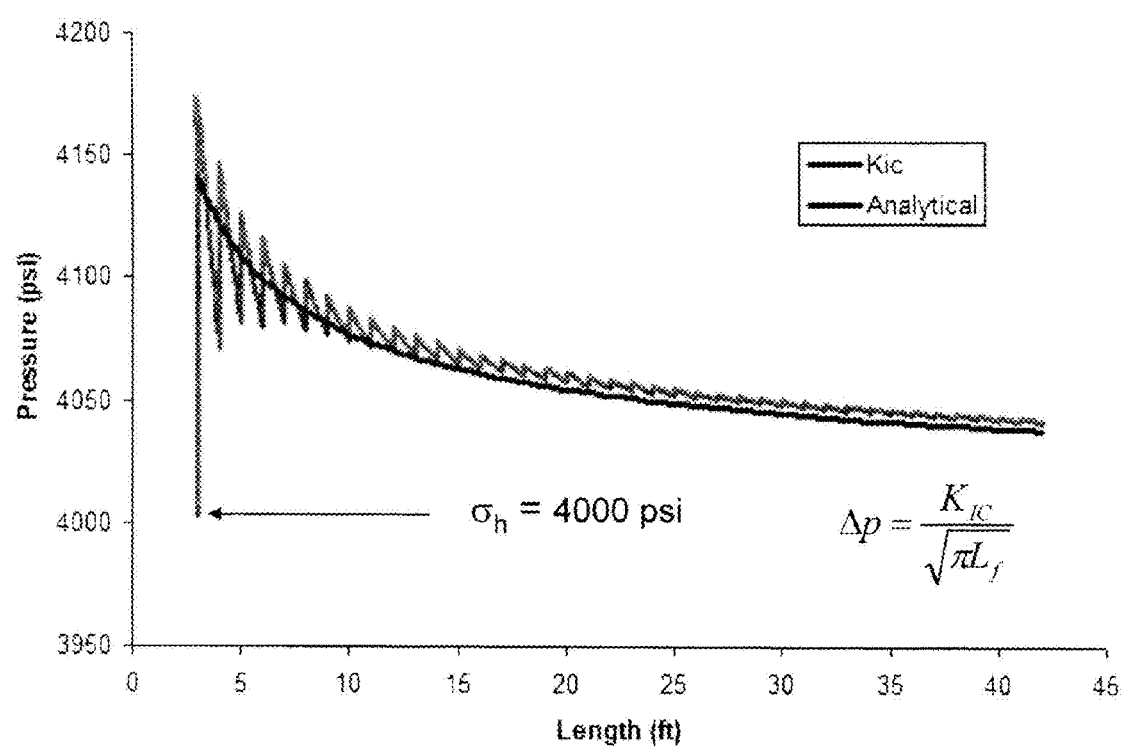
FIG. 16 shows a plot of the injection pressure of a low viscosity fluid versus the fracture length.

This example looks at fracture growth predictions using the fracture propagation criterion based on the stress intensity factor and the fracture criterion based on the cohesive model. This example is setup with reservoir properties that ensure that the fracture predictions are very sensitive to the fracture propagation criteria. An injection well is located in one corner of a square pattern that is 1000 ft×1000 ft×20 ft in the x, y, and z directions, respectively. The problem assumes plane strain conditions in the z-direction and consequently the displacements in the z-direction are zero. It is also assumed that the fracture propagates in the x-direction and the minimum in-situ stress is 4000 psi in the y-direction. The porosity in the reservoir is zero and all the injected fluid remains in the fracture. The grid has 55 grid blocks each of length 1 ft in the fracture direction and the spacing starts becoming larger beyond 55 ft. The simulation includes only one wing of the fracture and models only half of the total fracture width. The reservoir grid near the fracture is shown in FIG. 7 along with the fracture grid. The fracture grid is discretized into 55 one-foot grid blocks in order to be compatible with the reservoir grid. A low viscosity fluid (0.1 cp) is injected at a surface rate of 25 bbl/min (total well rate would be 100 bbl/min) for 10 minutes. FIG. 16 shows a plot of the injection pressure versus the fracture length.

The elastic modulus and Poisson's ratio for the reservoir are 2.0E6 psi and 0.35, respectively, and the critical stress intensity factor is 1500 psi√in. Assuming that the pressure drop is zero down the fracture and the fluid fills the entire fracture then the fracture length may be expressed as:

$$L = \left(\frac{QEt}{\sqrt{\pi}(1-v^2)K_{IC}\Delta z}\right)^{2/3}, \tag{34}$$

where Q above is the total reservoir rate for one wing of the fracture (50 bbl/d), and $\Delta z$ is the fracture height (20 ft). The assumption in Equation 34 is that the stress intensity factor for a uniformly pressurized fracture is given by $K_1 = \sqrt{\pi L}\Delta p$, where $\Delta p$ is the excess pressure, that the fracture is elliptic and the relationship between the injected volume and the fracture volume for one wing of the fracture is given by $Qt = \pi w_0 L \Delta z/4$, where $w_o$ is the total fracture width at the wellbore and L is the half-length, and the fracture width at the wellbore is given by $4(1-v^2)L\Delta p/E$. After 10 minutes of injection, Eq. 34 predicts that the fracture should be at 43.8 ft, i.e. the fracture should propagate across approximately 44 grid blocks in the fracture and reservoir grids. Similar analytical equations for fracture width and fluid pressure predict that the fracture width at the wellbore and the fluid pressure in the fracture should be approximately 0.002836 ft and 4037 psi, respectively, after 10 minutes. Note in the equation above that the fracture length is unbounded as the stress intensity factor goes to zero.

Figure 17:
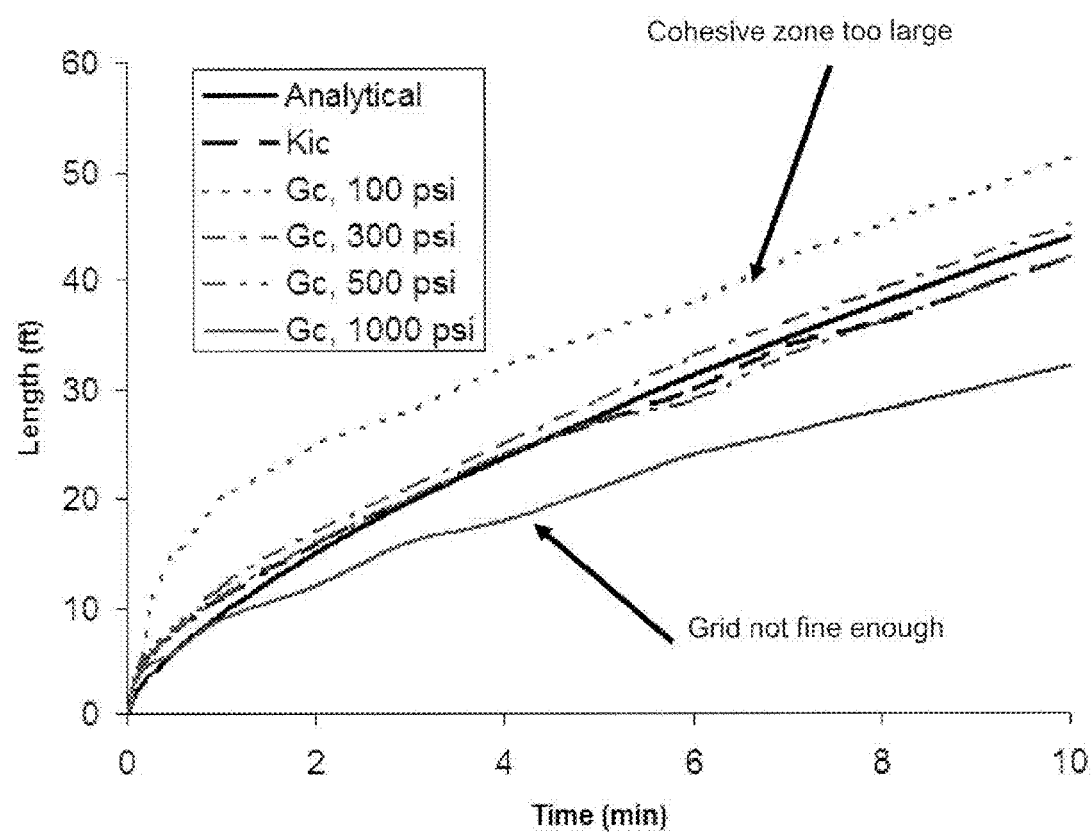
FIG. 17 shows predicted results for the stress intensity factor, and the cohesion models with different values of the tensile stress.

The system was simulated using a stress intensity factor of 1500 psi√in, and also using the cohesive model with an energy release rate of 0.987188 psi-in. The cohesive model also requires a tensile stress value, and four runs were performed using tensile values of 100, 300, 500, and 1000 psi. Since the cohesive zone is modeled by cohesive elements at the fracture tip, one cannot expect to obtain accurate predictions for fracture propagation using a cohesive model unless the grid is fine enough to resolve the cohesive zone at the fracture tip. For the values of tensile stress used here, the predicted values of the cohesive zone using the rough approximation for $r_c$ given in Eq. 33 are 7.4, 0.8, 0.3, and 0.07 ft, respectively. FIG. 17 shows the predicted results for the stress intensity factor, and the cohesion models with different values of the tensile stress.

For the cohesive runs, FIG. 17 assumes that the fracture tip is at the tip of the cohesive zone. The pressure drop down the fracture was negligible for the simulations which is consistent with the assumption in the analytical equation; for example, for the cohesive run using a tensile stress of 300 psi the pressures were 4038 psi in all cells except for the cell at the fracture tip where the fluid pressure was 4037 psi. These pressures compare well with the analytical fluid pressure of 4037 psi. In addition, the cohesive case with a tensile stress of 300 psi predicts a total fracture width of 0.002870 ft which compares favorably with the analytical value of 0.002836 ft.

The numerical predictions of fracture length agree fairly well with the analytical results for the simulation using the stress intensity factor and for the cohesive runs using tensile stresses of 300 and 500 psi. However, there are significant deviations from the analytical results for the cohesive cases using tensile stresses of 100 and 1000 psi. For the tensile case of 100 psi, the model predicts a cohesive zone length that is 15 ft and a fracture length of 51 ft. The cohesive zone length of 15 ft is twice as large as the rough estimate for the cohesive zone obtained earlier. For this run, the length of the cohesive zone is not small compared to the fracture length so one would not expect the cohesive model with 100 psi tensile stress to agree with the analytical results. This is because the analytical results assume that any plastic zone (or cohesive zone) is small relative to the fracture dimensions, which is not the case for the cohesive model with 100 psi tensile stress. For the cohesive model with tensile stress of 300 psi, the simulation results predict a cohesive zone length of approximately 2 ft. Again, this is about twice that size of the rough estimate obtained earlier. A second simulation was performed for the cohesive model with tensile stress of 300 psi using grid block sizes of 0.25 ft. For this finer run, the predicted fracture length was 44.5 ft (instead of 45.0 ft seen in the coarser run) and the size of the cohesive zone was 1.75 ft (i.e. there were 7 cohesive elements at the tip). Also, for the finer run the predicted fracture width at the wellbore is 0.002834 ft which compares well with the analytical value of 0.002836 ft.

Figure 18:
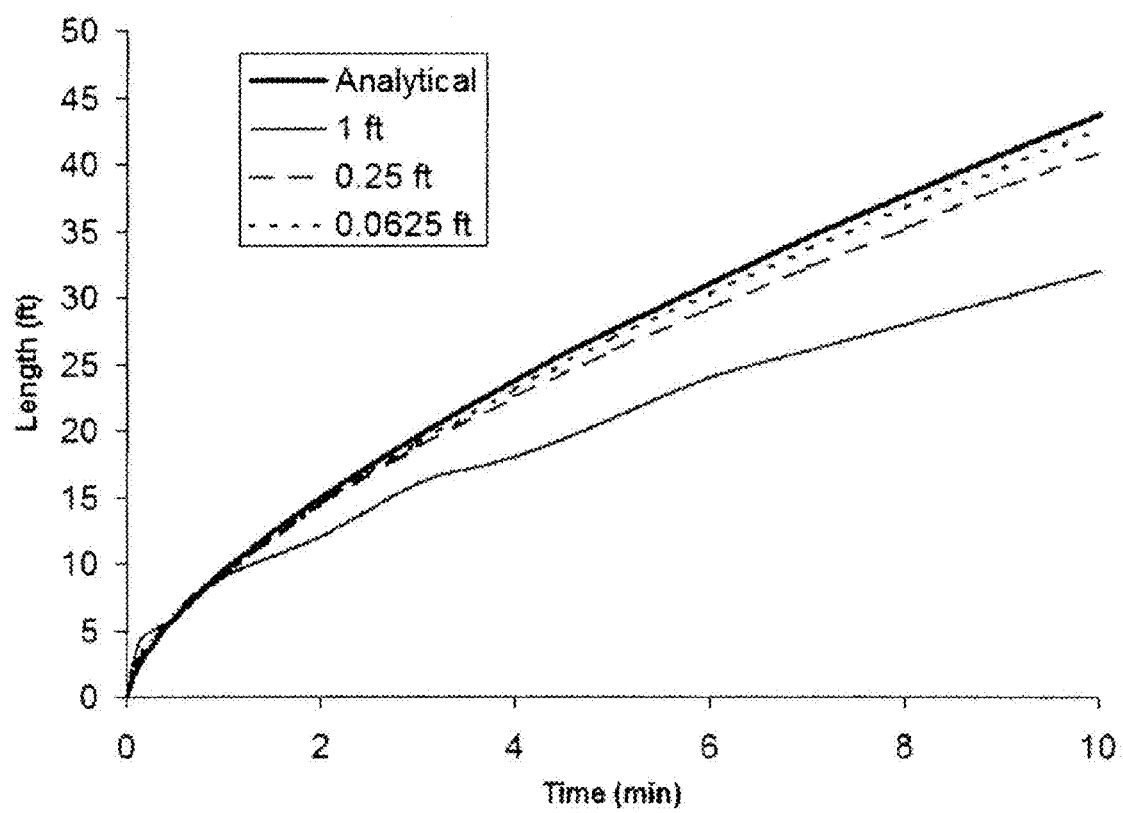
FIG. 18 shows the predicted fracture lengths for the three different grid sizes.

For the cohesive run using a tensile stress of 1000 psi, the coarse grid (1 ft cells) simulation predicts a final fracture length of 32 ft. This compares poorly with the analytical equation which predicts a fracture length of 43.8 ft after 10 minutes of injection. If it is assumed that the earlier estimate of the size of the cohesive zone is off by a factor of two, then the cohesive zone size for this case should be approximately 0.15 ft. A cohesive zone this small cannot be resolved on a grid spacing of 1 ft. With a grid spacing of 1 ft for this run, the cohesive model becomes merely a tensile stress propagation option (since the cohesive zone is not resolved) and one would expect to see strong grid dependence until the grid becomes finer than the size of the cohesive zone. For this reason, the cohesive run with tensile stress of 1000 psi was repeated with grid sizes of 0.25 ft and 0.0625 ft. For the finest grid, the fracture propagated across more than 680 grid blocks. FIG. 18 shows the predicted fracture lengths for the three different grid sizes. One can see that the results approach the analytical equation as the grid is refined. For this case, one would expect that very fine grid results should be very similar to the analytical predictions since the cohesive zone is very small relative to the fracture length. The cohesive zone for the finest grid extended across two grid blocks which corresponds to a length of 0.125 ft. The fine grid simulations performed for this example do not asymptote exactly to the analytical results because the simulation has a fluid compressibility and the volume of fluid in the reservoir is approximately 1% less than the volume of fluid at surface conditions.

For the finest grid (0.0625 ft cells) the final fracture width, fluid pressure, and fracture length were 0.002886 ft, 4039 psi, and 42.6 ft, respectively, which compares favorably with the analytical results of 0.002836 ft, 4037 psi, and 43.8 ft, respectively.

The speed, stability, and accuracy of the two different propagation criteria are compared. The stress intensity factor approach runs quicker and shows fewer stability problems than the cohesive model, while the cohesive model appears to be more accurate for the discretizations used in this study. For the simulations with the 1 ft grid blocks, the cohesive model with tensile stress of 300 psi took about 40% longer to run than the approach using the stress intensity factor and the cohesive model was also more unstable for runs using large time steps. The additional CPU time for the cohesive run appeared to be due to an increased number of linear iterations when the same time step sizes were used for both runs. Even though the cohesive option runs more slowly than the stress intensity factor option, the cohesive runs appear to produce more accurate results. For example, the coarse grid runs (1 ft cells) predict fracture widths of 0.003014 ft and 0.002870 ft for the stress intensity factor run and the cohesive run, respectively. Repeating the runs with a finer grid (0.25 ft cells), the results were 0.003018 ft and 0.002824 ft, respectively. The stress intensity factor approach did not appear to converge towards the analytical value of 0.002836 ft with finer gridding while the cohesive approach showed improved results on the finer grid. This is probably because the stress intensity factor approach has a square root singularity for the displacements at the fracture tip and the linear approximation right at the fracture tip does not improve with grid refinement. One would probably see improved convergence for the stress intensity factor approach if the fracture opening were evaluated at a fixed distance behind the tip rather than at the node nearest to the tip. This convergence problem is avoided in some programs by using special elements near the fracture tip. The cohesive elements probably show improved results on finer grids because they do not experience the same singular behavior at the fracture tip. Cohesive elements avoid the singular behavior by limiting the magnitudes of the stresses near the fracture tip.

7.1.2 Plane Strain Fracture with High Viscosity Fluid

This example looks at fracture growth predictions using a large fluid viscosity. Having a large fluid viscosity increases the chances that that a dry zone develops at the fracture tip. The grid in this example is the same as in the previous fine grid example (¼ ft grid blocks) with an injection well located in one corner of a square pattern that is 1000 ft×1000 ft×20 ft in the x, y, and z directions, respectively. All parameters are the same as in the previous example, but the elastic stiffness is 15.0E6 psi and the stress intensity factor is 500 psi√in.

Figure 19:
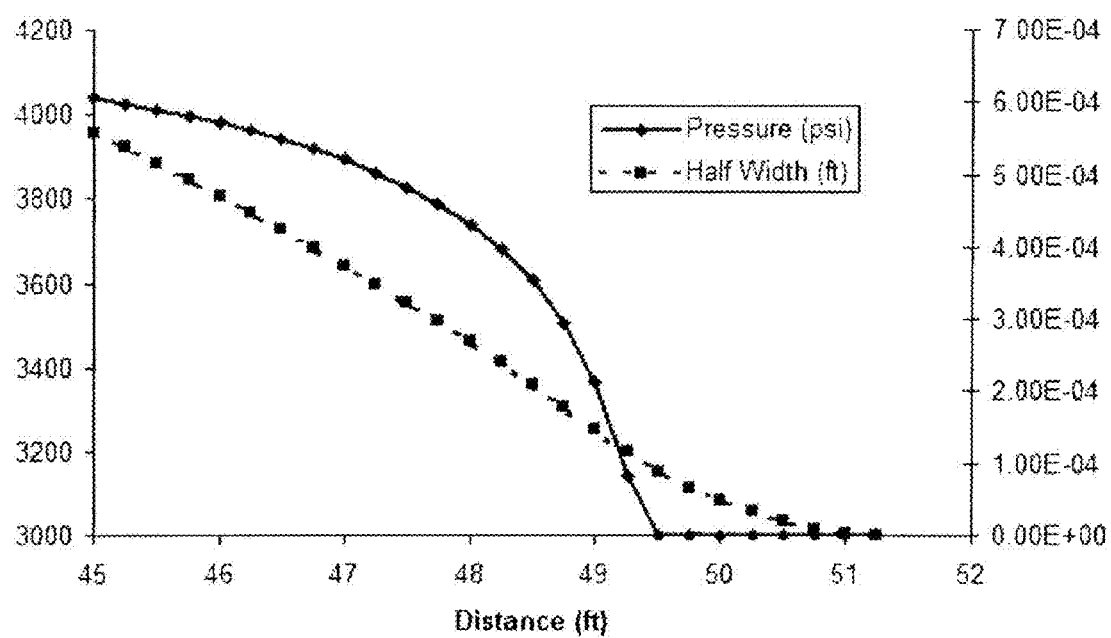
FIG. 19 shows the fluid pressures and fracture half-widths in the region near the tip of a fracture.

The input parameter of the fluid pressure in the dry zone is supplied to the program when performing simulations containing a dry zone. Given a fluid pressure in the dry zone, the program automatically determines the size of the dry zone during a simulation. The minimum initial in-situ stress for this example is 4000 psi so cases were run using dry zone pressures of 3000, 2000, 1000, and 0 psi. For the case with a dry zone pressure of 3000 psi, the program predicts a fracture length of 51.25 ft with a dry zone at the tip of the fracture that is 1.9 ft long. For grid block sizes of 0.25 ft, this corresponds to having 7 grid blocks that are completely dry and having one grid block at the leading edge of the fluid that is 41% saturated with fluid. FIG. 19 shows the fluid pressures and fracture half-widths in the region near the tip of the fracture. The program generates fluid pressures at the cell centers, but the values in FIG. 19 are interpolated to be at the edges of each cell so that the pressures and widths would be plotted at the same locations. The smooth closure at the fracture tip is due to the presence of the dry zone. The fluid pressure at the well for this case is 4443 psi so there is a 1443 psi pressure drop along the fracture with most of the pressure drop occurring near the end of the fracture.

The same run was repeated but with a stress intensity factor of 1500 psi√in which gave a fracture length of 50.75 ft and a dry zone size of 1.45 ft. In this problem, the stress intensity factor does not have a strong influence on the results. For the runs with a stress intensity factor of 500 psi√in and dry zone pressures of 2000, 1000, and 0, the fracture lengths were all 49.0 ft and the dry zone lengths were less that two grid blocks (0.5 ft) for the 2000 and 1000 psi cases and less than one grid block (0.25 ft) for the 0 psi case.

Thus, it is demonstrated that a dry zone may develop naturally at the tip of a propagating fracture when there is a significant pressure drop in the fracture. The size of the dry zone is dependent on the assumptions about the pressure in the dry zone, but in most cases the length of the zone is much smaller than the fracture length. In addition, this example shows that the fracture propagation criteria may play a minor role for problems involving large pressure drops down the fracture.

7.1.3 Penny-Shaped Fracture with Low Viscosity Fluid

This example simulates the growth of a penny-shaped fracture. It illustrates the program's capability of modeling general planar fracture growth in a plane. A viscosity of 1 cp is used for the fluid so that the fluid pressure is nearly uniform throughout the fracture. The program is capable of handling unstructured grids but square grid blocks have been used for this simulation to demonstrate the program's ability to reproduce the circular profile of the fracture even when using a regular discretization. The simulation includes only one quarter of the fracture and models only half of the total fracture width since the fracture is at the boundary of the 3D grid. The 3D grid for the reservoir has 40 grid blocks in each of the three directions where each grid block is 5 ft×5 ft×5 ft. The reservoir is nonporous, gravity is turned off (i.e., not taken into account), and a well is completed at the corner of the grid. The fracture grid also has 40 grid blocks in the x and directions and matches the xz-face of the reservoir grid. The elastic modulus and Poisson's ratio are 1.0E6 psi and 0.25, respectively, the minimum in-situ stress is 2000 psi, and the stress intensity factor is 1500 psi√in.

Figure 20:
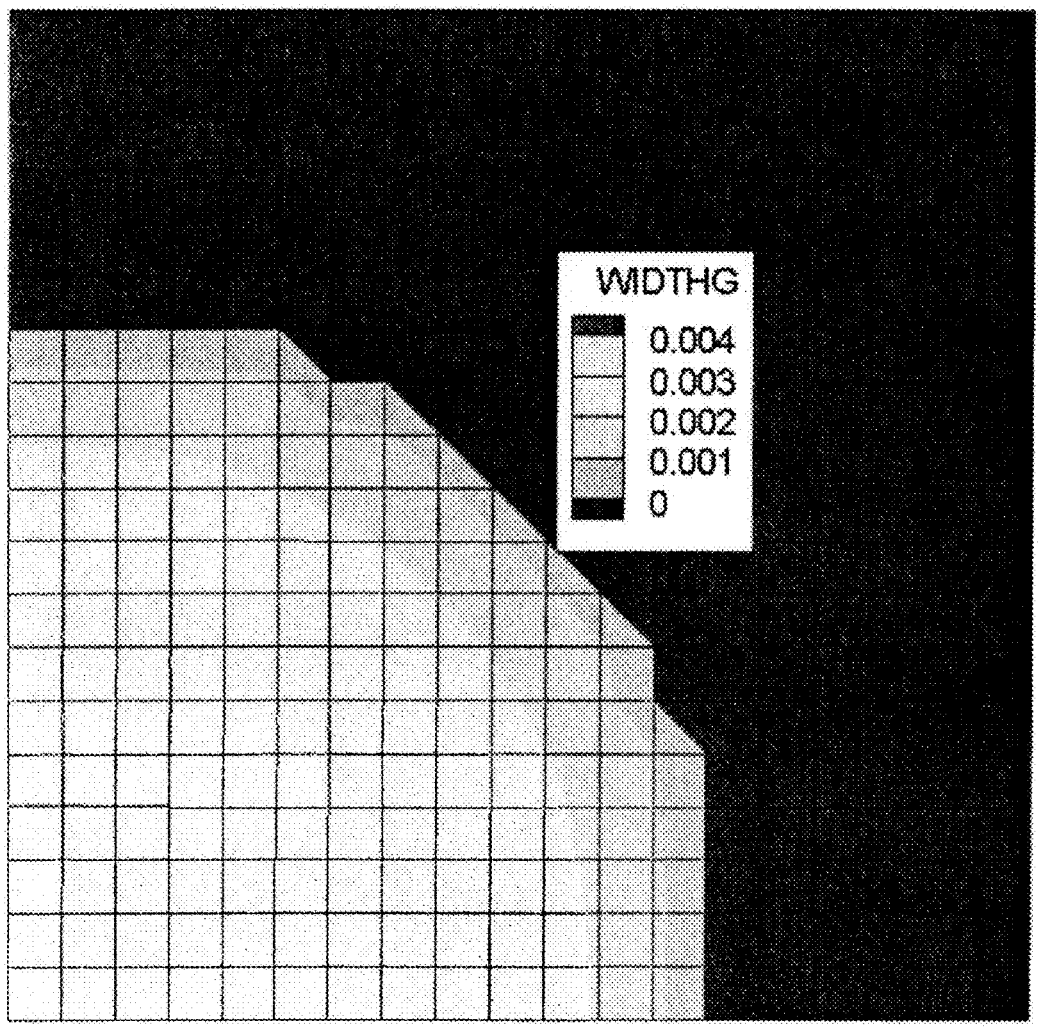
FIG. 20 shows the fracture half-widths during a simulation.
Figure 21:
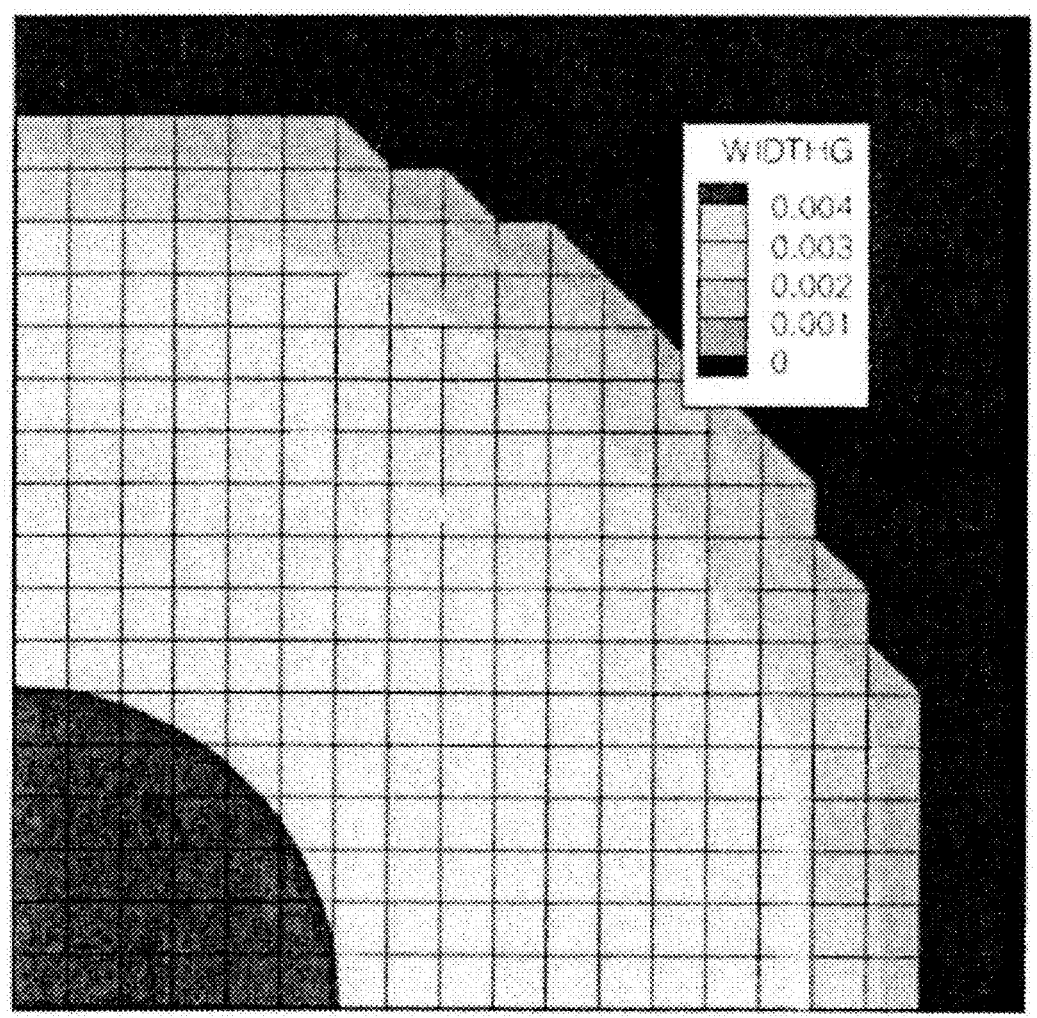
FIG. 21 shows the fracture half-widths at the end of a simulation.

Fluid is injected at a surface rate of 0.25 bbl/min (full well rate is 2 bbl/min) for 12 minutes. In that time, the fracture grows to a radius of 85 ft. FIG. 20 shows the fracture half-widths half way through the simulation (at 6 minutes). FIG. 21 shows the fracture half-widths at the end of the simulation (at 12 minutes). The program does a good job of approximating the circular shape of the fracture even though the grid consists of square elements.

Figure 22:
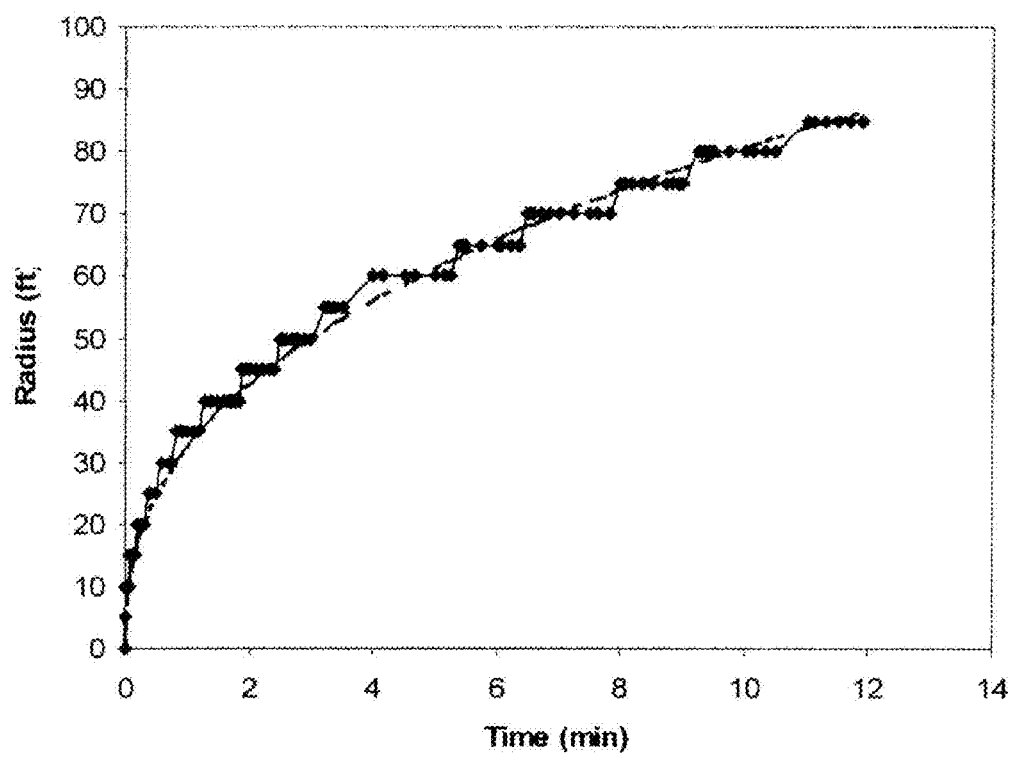
FIG. 22 shows a comparison of predicted fracture lengths to analytical fracture lengths, where the dashed line corresponds to the analytical results.

Using the Sneddon solution for a penny-shaped crack and the fact that the stress intensity factor for a penny-shaped crack satisfies the equation $K_1=2\sqrt{R/\pi}\Delta p$ where $\Delta p$ is the excess pressure, the radius for a propagating penny-shaped fracture with uniform pressure is given by $$R = \left(\frac{3QEt}{2\sqrt{\pi}(1-v^2)K_{IC}}\right)^{2/5}, \quad (35)$$

where R is the fracture radius and Q is the injection rate at the surface for a quarter of the fracture (twice the rate used in the simulation). The assumption in Equation 35 is that the stress intensity factor for a uniformly pressurized penny-shaped fracture is given by $K_1=2\sqrt{R/\pi}\Delta p$ where $\Delta p$ is the excess pressure, that the fracture is an ellipsoid and the relationship between the injected volume and the fracture volume for one quarter of the fracture is given by $Qt=\pi w_0 R^2/6$ where $w_o$ is the total fracture width at the wellbore, and the fracture width at the wellbore is given by $8(1-v^2)R\Delta p/\pi E$. FIG. 22 uses Eq. 35 to compare predicted fracture lengths to analytical fracture lengths, where the dashed line corresponds to the analytical results. The simulation results in FIG. 22 are the location of the fracture tip along the x-axis. The dots in the figure represent the fracture length for each time step in the simulation. The simulation uses 5 ft grid blocks so the fracture advance occurs in 5 ft increments which is the reason for the discrete fracture steps seen in the plot. Even though the grid is fairly coarse for this application, there is a good match between simulation and analytical results. After 12 minutes, the computational results show a maximum pressure of 2038.3 psi at the wellbore and a minimum pressure of 2037.4 psi at the tip with no evidence of a dry zone. The numerical results compare favorably to the analytical result which predicts a fluid pressure of 2040.6 psi in the fracture at 12 minutes.

This example for the growth of a penny-shaped fracture demonstrates the ability of the program to model general fracture growth in a plane. The program produces a good representation of the circular fracture even when using a rectangular grid for the fracture and the predicted fracture growth compares well with simple analytical results.

7.1.4 Analysis of the Numerical Results

The fracture propagation criterion based on a stress intensity factor appears to be the most stable and quickest technique for predicting fracture growth in the numerical results below, but it does not appear to be as accurate as the cohesive technique when the gridding is fine enough to resolve the cohesive zone at the fracture tip. The fracture propagation criterion based on a cohesive zone produces accurate results when the grid is fine enough to resolve the cohesive zone eliminating the stress singularity at the fracture tip. However, very fine grids may be required for problems where the cohesive zone is small. The simulation results show that the size of the cohesive zone can be estimated by the equation $(\pi/4)(K_{IC}/\sigma_c)^2$ which is a factor of two larger than the rough estimate in Equation 33. The two fracture propagation criteria produce similar results when the grid is fine enough to resolve the cohesive zone and when the cohesive zone is small compared to the fracture length.

8. REFERENCES CITED

All references cited herein are incorporated herein by reference in their entirety and for all purposes to the same extent as if each individual publication or patent or patent application was specifically and individually indicated to be incorporated by reference in its entirety herein for all purposes. Discussion or citation of a reference herein will not be construed as an admission that such reference is prior art to the present invention.

9. MODIFICATIONS

Many modifications and variations of this invention can be made without departing from its spirit and scope, as will be apparent to those skilled in the art. The specific examples described herein are offered by way of example only, and the invention is to be limited only by the terms of the appended claims, along with the full scope of equivalents to which such claims are entitled.

As an illustration of the wide scope of the systems and methods described herein, the systems and methods described herein may be implemented on many different types of processing devices by program code comprising program instructions that are executable by the device processing subsystem. The software program instructions may include source code, object code, machine code, or any other stored data that is operable to cause a processing system to perform the methods and operations described herein. Other implementations may also be used, however, such as firmware or even appropriately designed hardware configured to carry out the methods and systems described herein.

The systems' and methods' data (e.g., associations, mappings, data input, data output, intermediate data results, final data results, etc.) may be stored and implemented in one or more different types of computer-implemented data stores, such as different types of storage devices and programming constructs (e.g., RAM, ROM, Flash memory, flat files, databases, programming data structures, programming variables, IF-THEN (or similar type) statement constructs, etc.). It is noted that data structures describe formats for use in organizing and storing data in databases, programs, memory, or other computer-readable media for use by a computer program. As an illustration, a system and method can be configured with one or more data structures resident in a memory for storing data representing a two-dimensional grid and a three-dimensional grid. Software instructions (executing on one or more data processors) can access the data stored in the data structure for generating the results described herein).

The systems and methods may be provided on many different types of computer-readable media including computer storage mechanisms (e.g., CD-ROM, diskette, RAM, flash memory, computer's hard drive, etc.) that contain instructions (e.g., software) for use in execution by a processor to perform the methods' operations and implement the systems described herein.

The computer components, software modules, functions, data stores and data structures described herein may be connected directly or indirectly to each other in order to allow the flow of data needed for their operations. It is also noted that a module or processor includes but is not limited to a unit of code that performs a software operation, and can be implemented for example as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

It should be understood that as used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Finally, as used in the description herein and throughout the claims that follow, the meanings of "and" and "or" include both the conjunctive and disjunctive and may be used interchangeably unless the context expressly dictates otherwise; the phrase "exclusive or" may be used to indicate situation where only the disjunctive meaning may apply.

Appendix A

Outline

- Program Description and Applications
- Coupling of Fracture and Reservoir
- Fracture Propagation Criteria and Example
- Penny-shaped Fracture Example

Program Description

- Black-Oil and Compositional Porous Flow
- Poroelastic/Poroplastic Mechanics
- Thermal Conduction and Convection
- Hydraulic Fracture Growth
- Waste Disposal
- Unstructured Grids

Applications

- Hydraulic and Thermal Fracturing
- Subsidence
- Waste Disposal
- Sand Production and Cavity Creation
- Completion Strategies
- $CO_2$ Disposal

Coupling Grids and Physics

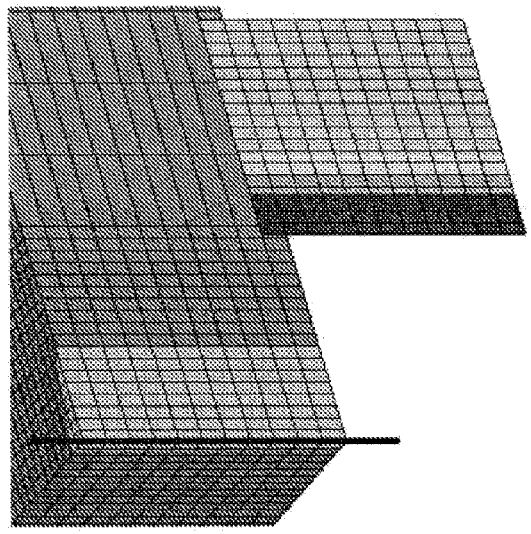

- Porous Flow, Geomechanics, and Thermal Included in One Program

- Separate Grids for Fracture and Reservoir Using Parallel Processing Approach to Couple Grids

- Coupling Options for Physics: Full, Iterative, Explicit, and One-Way

- Jacobian Fully Expanded to Enhance Numerical Stability and Preserve Second Order Convergence

- Form Linear System for all Equations and Solve Simultaneously

- Fractures Currently Limited to Boundary of Reservoir

Fracture Model

- Laminar Flow Between Parallel Plates in Fracture
- Porous Flow from Fracture Face into Reservoir
- Fracture Pressure Exerts Normal Traction on Reservoir
- Zero Normal Displacements in Fracture Plane Ahead of Fracture
- Node Release Based on Stress Intensity Factor or Cohesive Elements

Fracture Propagation Criteria
- ## Stress Intensity Factor
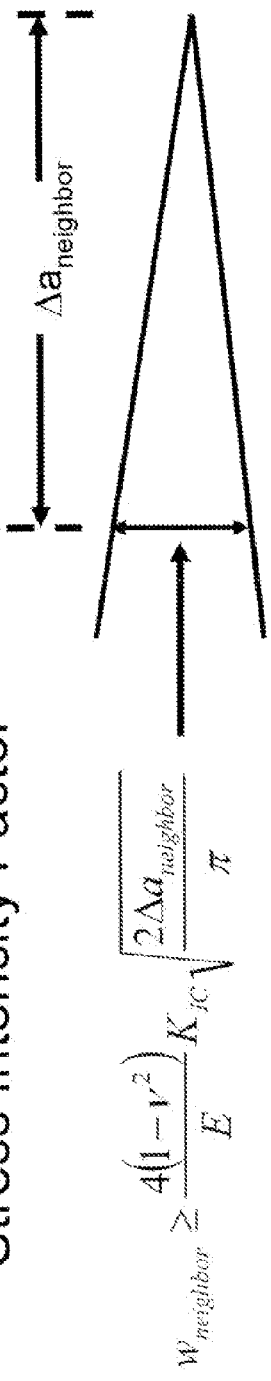
$$w_{neighbor} \geq \frac{4(1-\nu^2)}{E} K_{IC} \sqrt{\frac{2\Delta a_{neighbor}}{\pi}}$$
- ## Energy Release Rate and Cohesive Stress
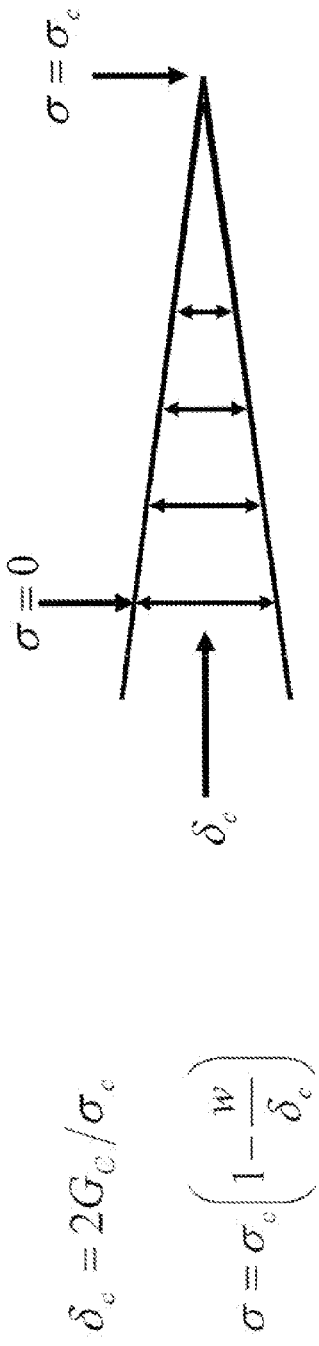
$$\delta_c = 2G_C/\sigma_c$$
$$\sigma = \sigma_c \left(1 - \frac{w}{\delta_c}\right)$$

Example for Propagation Criteria
- Plane Strain Fracture ($u_z = 0$, $\sigma_h = 4000$ psi)
- Reservoir Grid 1000 ft x 1000 ft x 20 ft (80 x 27 x 1)
- Fracture Grid 55 ft x 20 ft (55 x 1)
- Fluid Viscosity = 0.1 cp
- Inject at 25 bbl/min for 10 min
- No Flow in Reservoir
- $E = 2.0E6$ psi, $\nu = 0.35$
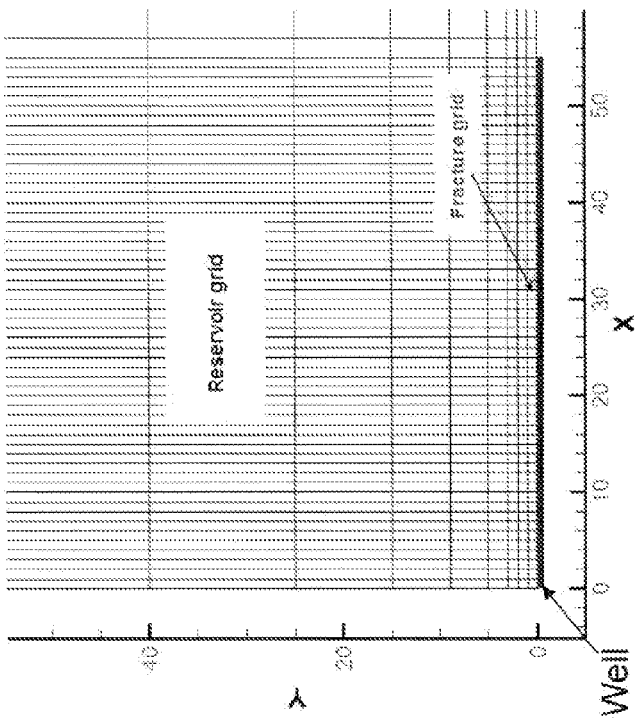

Example for Propagation Criteria

- Stress Intensity Factor $K_{IC} = 1500 \text{ psi}\sqrt{in}$

- Energy Release Rate and Cohesive Stress $G_{IC} = 0.987$ psi-in $\sigma_c = 100, 300, 500, 1000$ psi $$G_C = \frac{1-v^2}{E} K_{IC}^2$$

$$\delta_c = 2G_C/\sigma_c$$
  $\quad = 0.020 in \quad \sigma_c = 100\, psi$
  $\quad = 0.0020 in \quad \sigma_c = 1000\, psi$

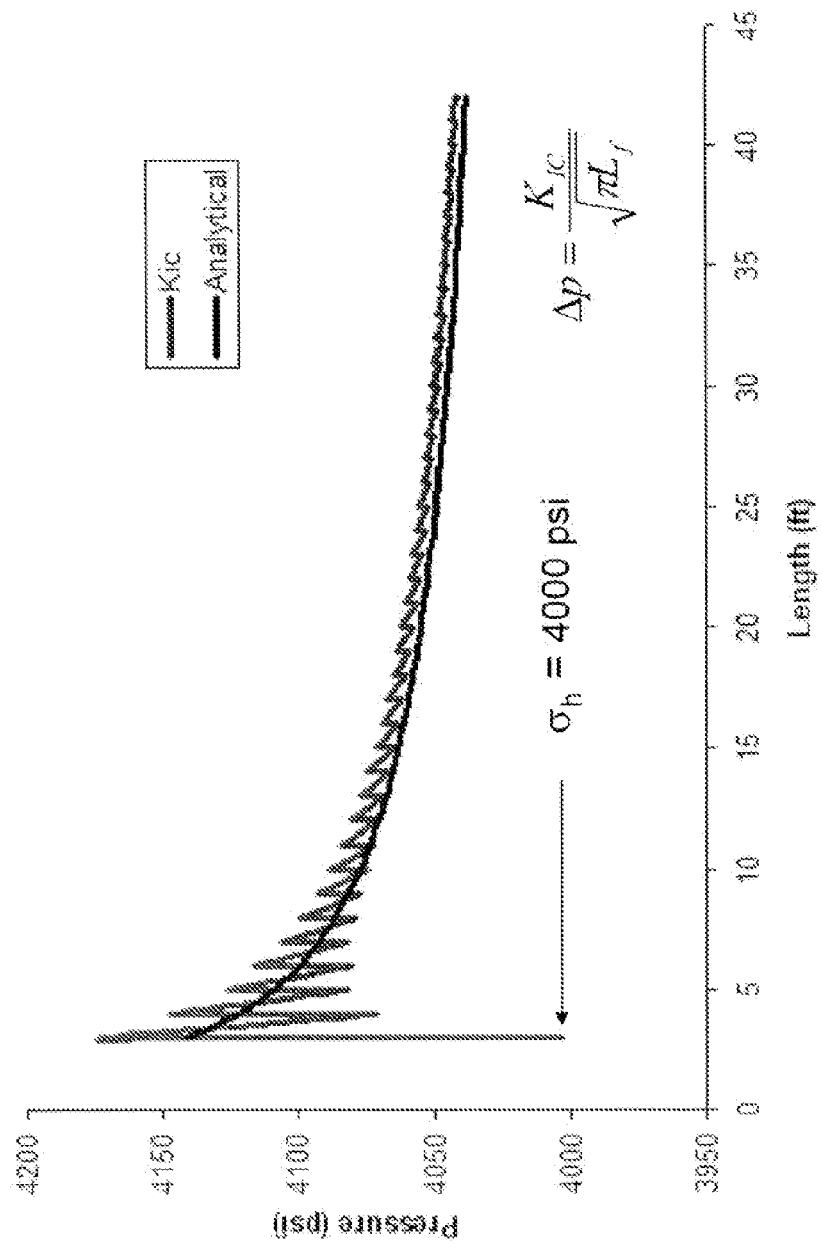

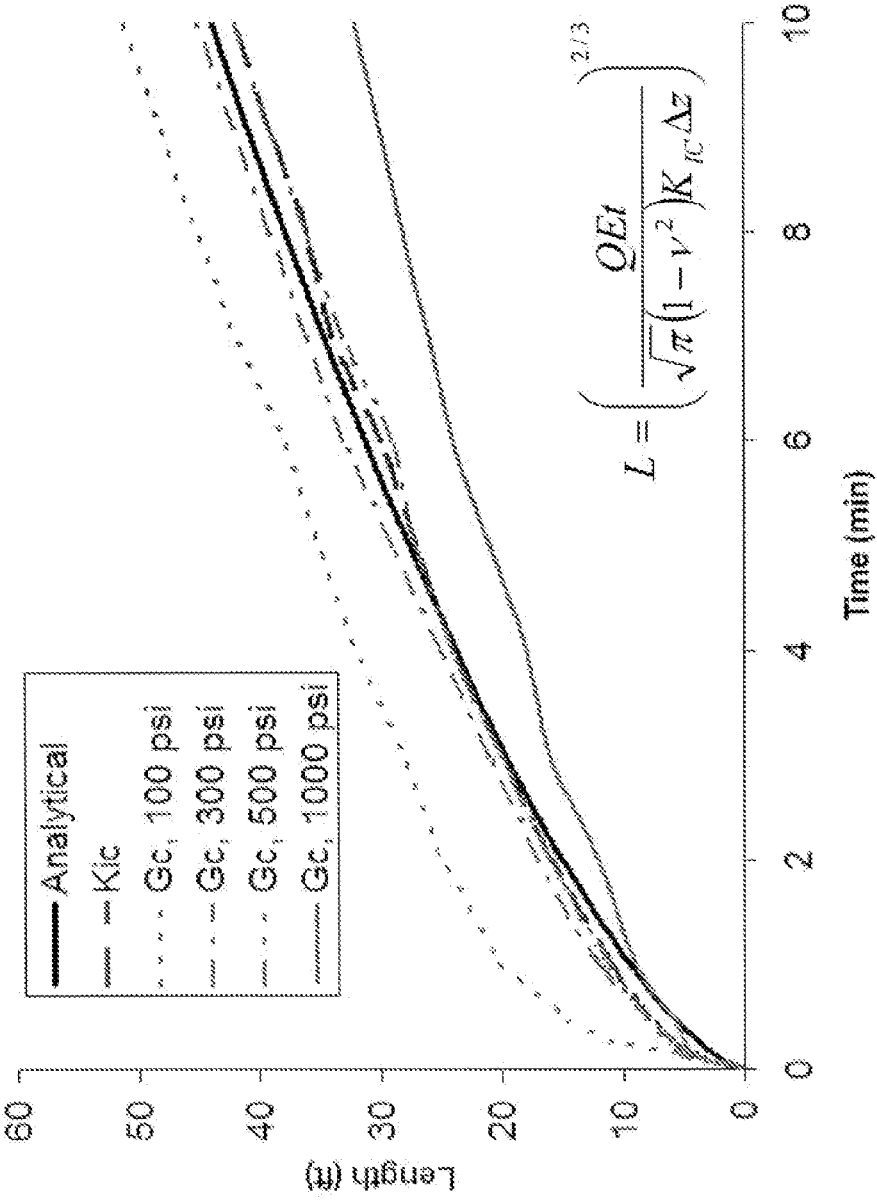

Cohesive Zone Lengths

| $\sigma_c$ | $\delta_c$ | Cohesive Zone Length |
|---|---|---|
| 100 psi | 0.020 in | 15 ft |
| 300 | 0.0066 | 1.8 |
| 500 | 0.0039 | 0.50 |
| 1000 | 0.0020 | 0.13 |

$$L_c \approx (\pi/4)(K_{IC}/\sigma_c)^2$$

Analytical    $w_o = 0.034$ in    $L_f = 44$ ft

Issues for Cohesive Model Comparison

- Elastic Comparisons Require Small Cohesive Zone Relative to Fracture Length

For $\sigma_c = 100$ psi:  $L_c = 15$ ft

But  $L_f = 44$ ft

- Accuracy Requires Discretization of Cohesive Zone

For $\sigma_c = 1000$ psi:  $L_c = 0.125$ ft

But  $\Delta x = 1.0$ ft

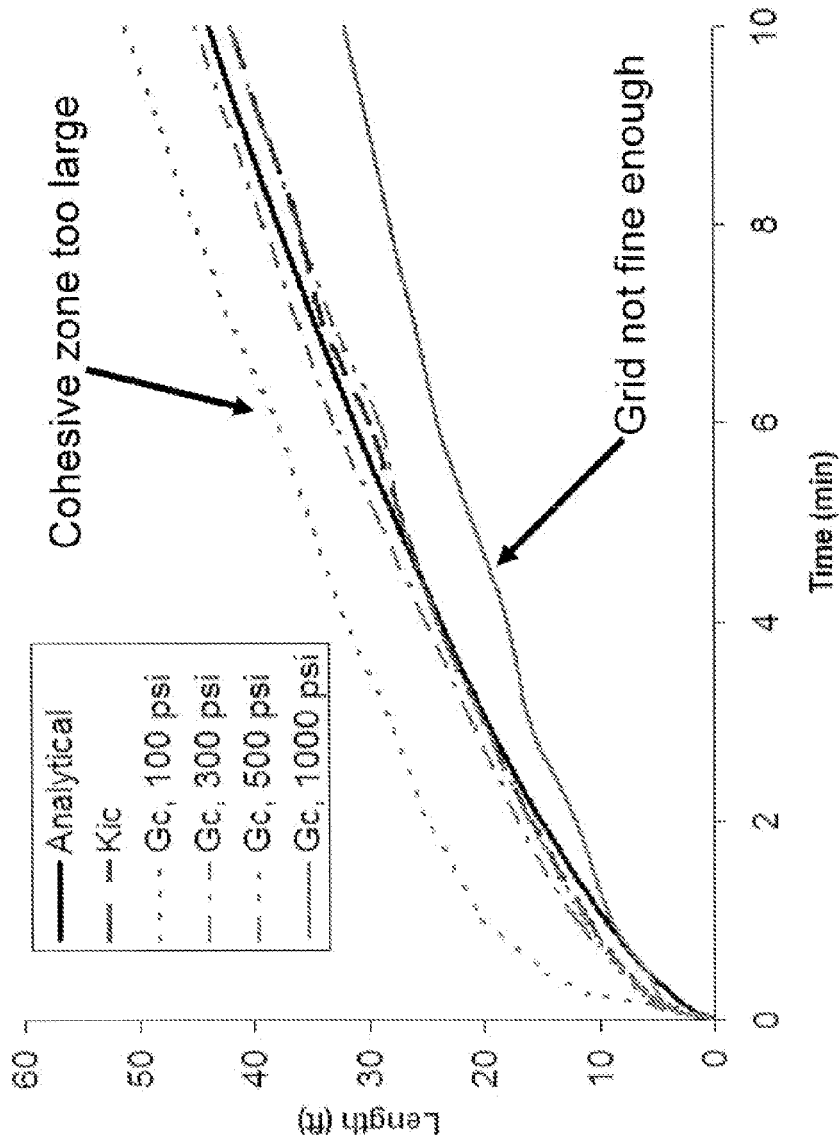

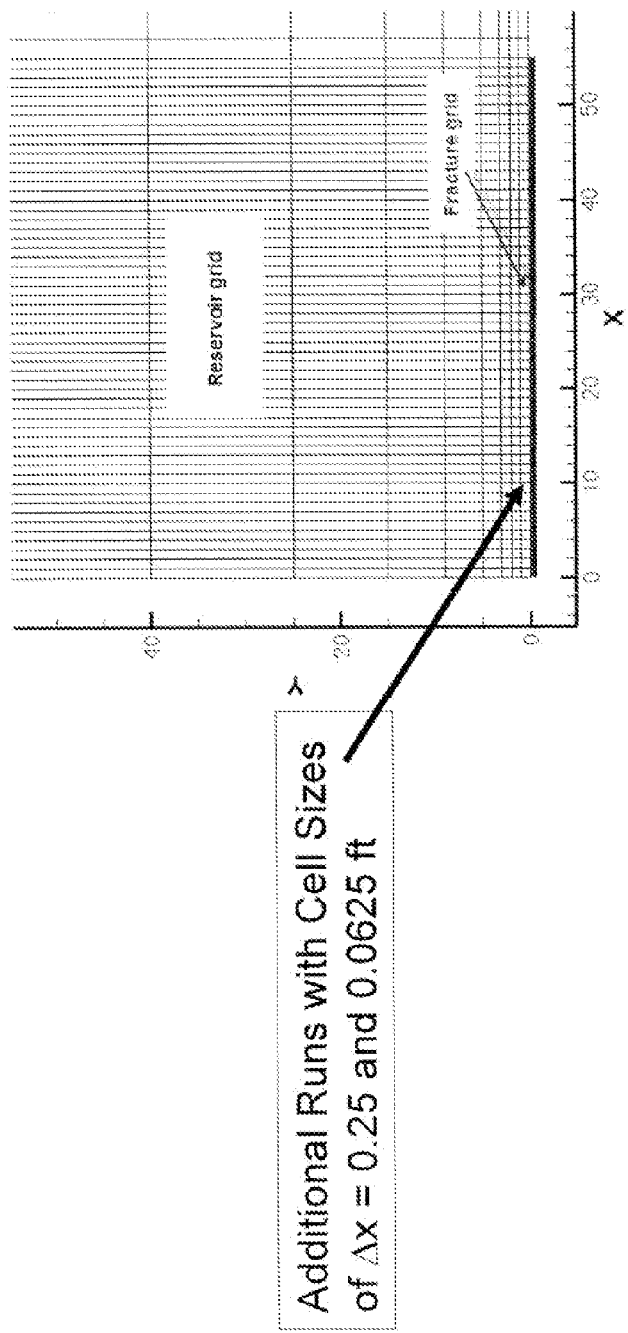

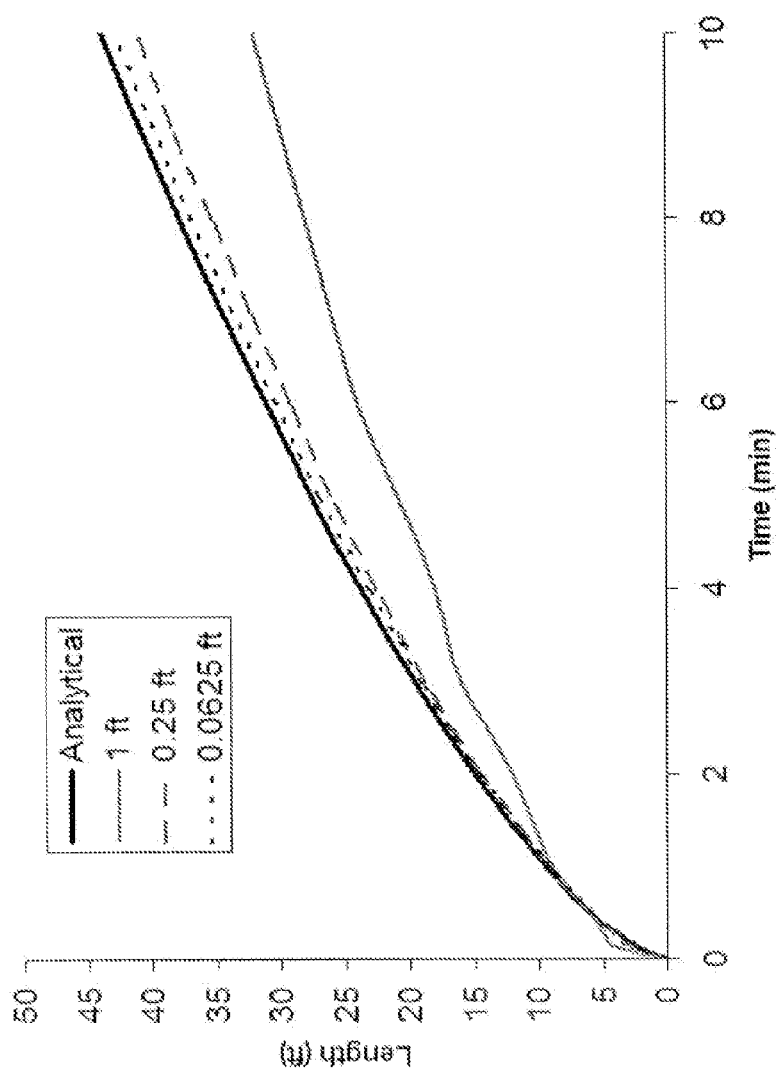

Comments on Fracture Propagation Criteria

- Both Techniques Produce Similar Results for Elastic Problems

- $K_{IC}$ Runs Require Less CPU Time Than Cohesive Runs and $K_{IC}$ Runs Are More Stable Than Cohesive Runs

- Cohesive Model Runs Produce More Accurate Results During Grid Refinement with the Current Implementation

- $K_{IC}$ Runs Are Restricted to Elastic Problems, or Plastic Problems Where the Plastic Zone is Small Relative to Fracture Length

Penny-Shaped Fracture Example
- Shows Capability of Program to Model Growth in Multiple Directions
- Tests Fracture Propagation Logic in Multiple Directions
- Analytic Result Available for No Leakoff and Low Viscosity
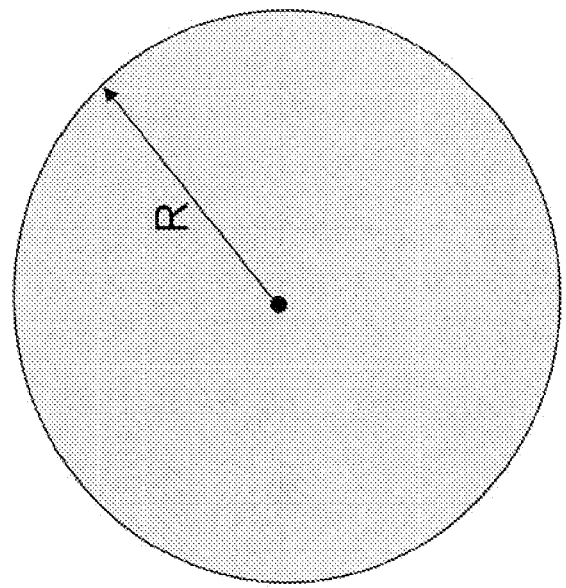
$$R = \left( \frac{3QEt}{2\sqrt{\pi}(1-\nu^2)K_{IC}} \right)^{2/5}$$

Penny-Shaped Fracture
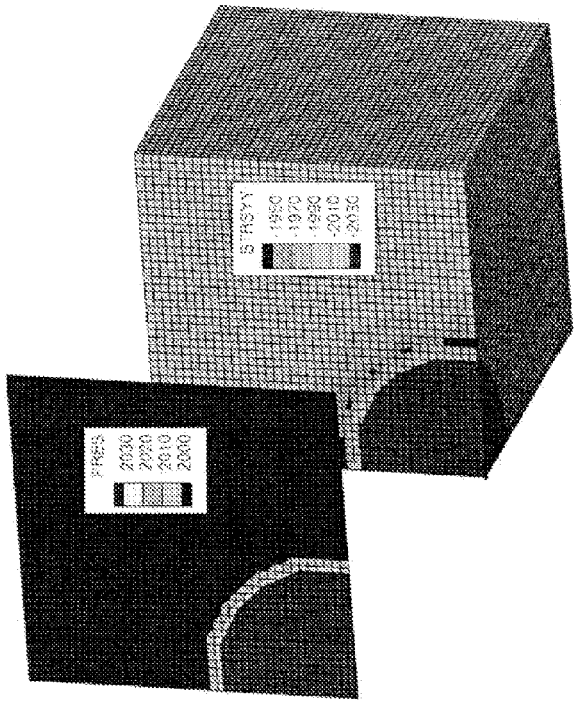
- Reservoir Grid  200 ft x 200 ft x 200 ft (40 x 40 x 40)
- Fracture Grid  40 ft x 40 ft (40 x 40)
- Fluid Viscosity = 1.0 cp
- Inject at 0.25 bbl/min for 12 min
- No Flow in Reservoir
- $E = 1.0E6$ psi, $\nu = 0.25$
- $\sigma_h = 2000$ psi
- $K_{IC} = 1500$ psi$\sqrt{in}$

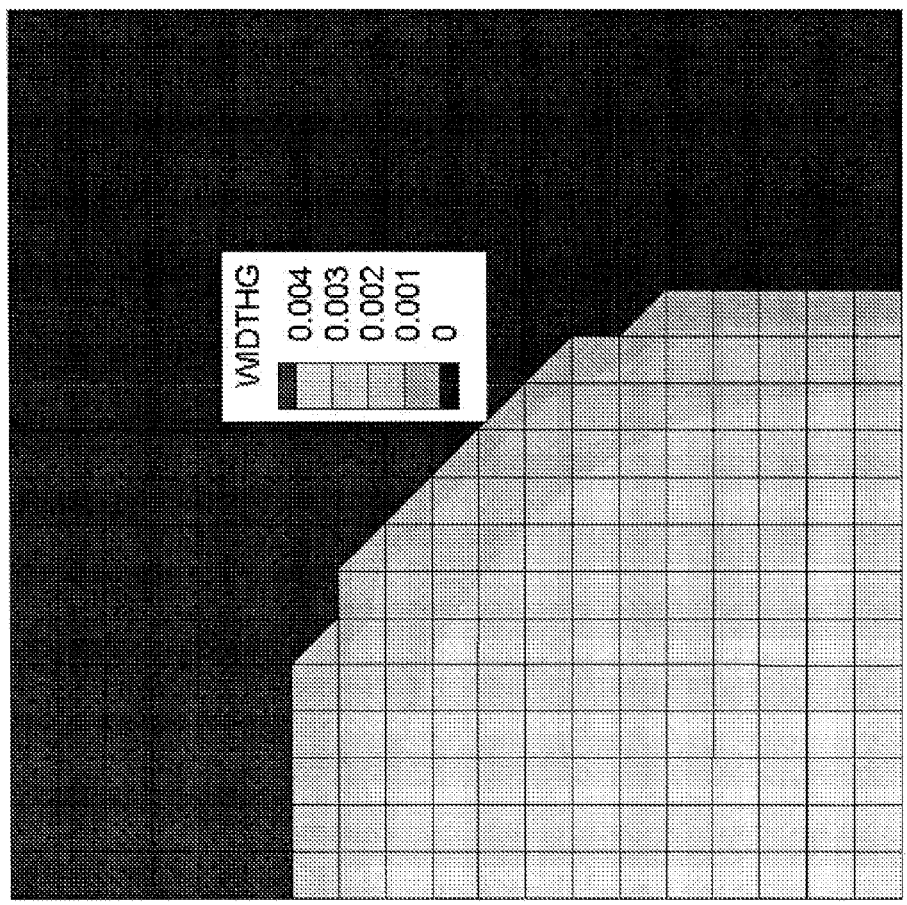

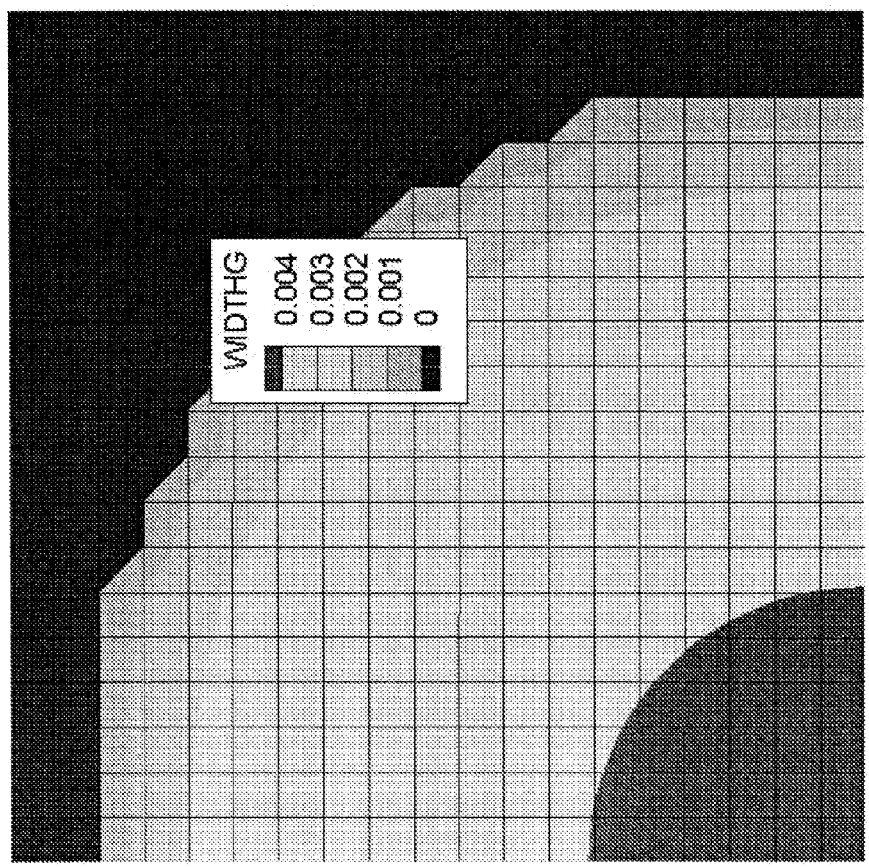
Penny-Shaped Fracture Widths at 12 Minutes
Units are ft

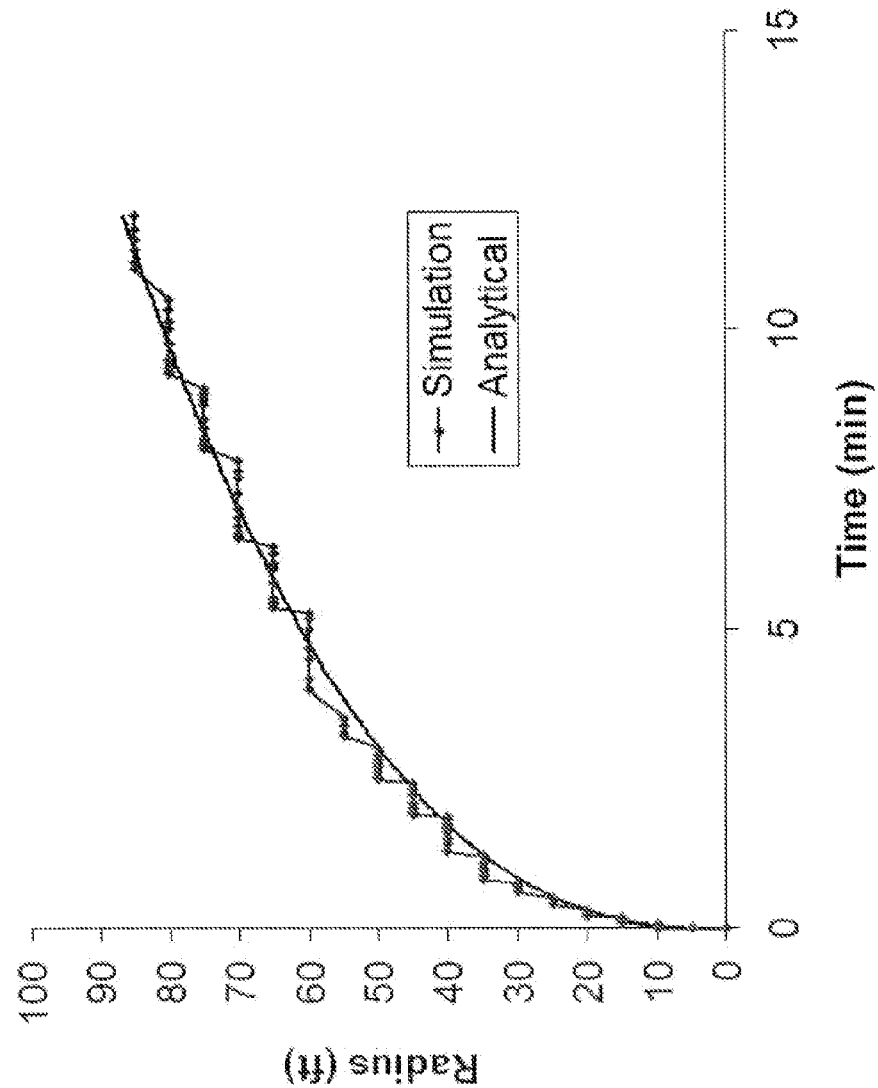

Comments

- A Fully-Coupled Geomechanical Model has been Developed for Modeling Hydraulic Fracture Growth

- Stress Intensity Factors and Cohesive Elements Produce Similar Results Under Appropriate Conditions

- Cohesive Elements Have a Larger Range of Applicability but Require More CPU Time and Are Less Stable

- Radial Shapes can be Reproduced Using Simple Rectangular Grids

What is claimed is:

1. A computer-implemented method for use in modeling a geomechanical reservoir system, comprising:
   receiving, through a computer system, data indicative of physical properties associated with the geomechanical reservoir system;
   generating, through a computer system, fracturing predictions by solving a system of partial differential equations that model the geomechanical reservoir system;
      wherein the system of partial differential equations comprises a reservoir flow model, a geomechanical model, and a fracture model of the geomechanical reservoir system;
      wherein the system of partial differential are coupled through a fully-expanded Jacobian;
      wherein the solving of the system of partial differential equations comprises solving simultaneously in a single timestep the fully-expanded Jacobian based upon the received physical properties data; and
      wherein the fracturing predictions model the geomechanical reservoir system for the timestep; and
   outputting or displaying, through a computer system, the generated fracturing predictions.

2. The method of claim 1, wherein a coupling variable in the fully-expanded Jacobian that couples fluid flow in the reservoir to the geomechanical model is at least one of an effective stress, a porosity and one or more displacements associated with the geomechanical model, wherein a coupling variable in the fully-expanded Jacobian that couples the geomechanical model to the fluid flow is at least one of a porosity and a permeability associated with the reservoir flow model, wherein a coupling variable in the fully-expanded Jacobian that couples the geomechanical model to the fracture model is a fracture width associated with the fracture model, and wherein a coupling variable in the fully-expanded Jacobian that couples fluid flow in the reservoir to the fracture model is a fluid pressure and a leakoff rate associated with the fracture model.

3. The method of claim 2, wherein the fully-expanded Jacobian comprises a partial time derivative, a time derivative, a spatial derivative, or a partial spatial derivative of at least one coupling variable.

4. The method of claim 3, wherein the fully-expanded Jacobian comprises a partial time derivative, a time derivative, a spatial derivative, or a partial spatial derivative of the fracture width.

5. The method of claim 1, wherein the system of partial differential equations further comprises a thermal model of the geomechanical reservoir system.

6. The method of claim 5, wherein a coupling variable in the fully-expanded Jacobian that couples the thermal model to the geomechanical model is a thermal stress associated with the thermal model, and wherein a coupling variable in the fully-expanded Jacobian that couples the thermal model to the reservoir flow model is at least one of a fluid viscosity, a conduction and a convection in the reservoir associated with the thermal model.

7. A computer-implemented method for use in modeling a fracture in a geomechanical reservoir system, comprising:
   receiving, through a computer system, data indicative of physical properties associated with the geomechanical reservoir system;
   defining, through a computer system, a three-dimensional grid comprising a plurality of three-dimensional cells, wherein each of the three-dimensional cells comprises a plurality of nodes;
   defining, through a computer system, a two-dimensional grid comprising a plurality of two-dimensional cells, wherein each of the two-dimensional cells comprises a plurality of nodes, and wherein each of the two-dimensional cells shares at least four nodes with a three-dimensional cell;
   generating, through a computer system, fracturing predictions by solving a system of partial differential equations that model the geomechanical reservoir system;
      wherein the system of partial differential equations comprises a reservoir flow model, a geomechanical model, and a fracture model of the geomechanical reservoir system;
      wherein the system of partial differential are coupled through a fully-expanded Jacobian;
      wherein the solving of the system of partial differential equations comprises solving simultaneously in a single timestep the fully-expanded Jacobian based upon the received physical properties data;
      wherein the reservoir model and the geomechanical model are computed on the three-dimensional grid; and
      wherein the fracture model is computed on the two-dimensional grid; and
      wherein the fracturing predictions model the geomechanical reservoir system for the timestep; and
   outputting or displaying, through a computer system, the generated fracturing predictions.

8. The method of claim 7, wherein a coupling variable in the fully-expanded Jacobian that couples fluid flow in the reservoir to the geomechanical model is at least one of an effective stress, a porosity and one or more displacements associated with the geomechanical model, wherein a coupling variable in the fully-expanded Jacobian that couples the geomechanical model to the fluid flow is at least one of a porosity and a permeability associated with the reservoir flow model, wherein a coupling variable in the fully-expanded Jacobian that couples the geomechanical model to the fracture model is a fracture width associated with the fracture model, and wherein a coupling variable in the fully-expanded Jacobian that couples fluid flow in the reservoir to the fracture model is a fluid pressure and a leakoff rate associated with the fracture model.

9. The method of claim 8, wherein the fully-expanded Jacobian comprises a partial time derivative, a time derivative, a spatial derivative, or a partial spatial derivative of at least one coupling variable.

10. The method of claim 9, wherein the fully-expanded Jacobian comprises a partial time derivative, a time derivative, a spatial derivative, or a partial spatial derivative of the fracture width.

11. The method of claim 7, wherein the system of partial differential equations further comprises a thermal model of the geomechanical reservoir system.

12. The method of claim 11, wherein a coupling variable in the fully-expanded Jacobian that couples the thermal model to the geomechanical model is a thermal stress associated with the thermal model, and wherein a coupling variable in the fully-expanded Jacobian that couples the thermal model to the reservoir flow model is at least one of a fluid viscosity, a conduction and a convection in the reservoir associated with the thermal model.

13. The method of claim 7, wherein each of the three-dimensional cell shares an interface with another three-dimensional cell, and wherein each the two-dimensional cell aligns with an interface of a three-dimensional cell.

14. The method of claim 7, wherein solving of the system of partial differential equations comprises applying a Newton-Raphson technique.

15. The method of claim 7, wherein a fracture width associated with the fracture model is determined from one or more displacements in the geomechanical model, the method further comprising a step of applying a fracture propagation criterion to the generated fracture predictions prior to outputting or displaying, through the computer system, the generated fracturing predictions.

16. The method of claim 15, further comprising, if the fracture propagation criterion is not satisfied:
    modifying one or more constraints on one or more nodes of the two-dimensional grid on a boundary of the fracture; and
    repeating the step of generating, through the computer system, the fracturing predictions.

17. The method of claim 15, wherein the fracture propagation criterion is based on a stress intensity factor or cohesive elements.

18. The method of claim 15, wherein applying the fracture propagation criterion comprises evaluating the fluid pressure, stress, and displacements near the fracture to determine if the fracture propagates.

19. A computer-implemented system for use in modeling a geomechanical reservoir system, the system comprising:
    one or more data structures resident in a memory for storing data representing a two-dimensional grid and a three-dimensional grid; and
    software instructions, for executing on one or more data processors, to generate the fracturing predictions by solving a system of partial differential equations that model the geomechanical reservoir system; wherein:
    the system of partial differential equations comprises a reservoir flow model, a geomechanical model, and a fracture model of the geomechanical reservoir system;
    the system of partial differential are coupled through a fully-expanded Jacobian;
    the solving of the system of partial differential equations comprises solving simultaneously in a single timestep the fully-expanded Jacobian based upon the received physical properties data;
    the reservoir model and the geomechanical model are computed on the three-dimensional grid;
    the fracture model is computed on the two-dimensional grid; and
    the fracturing predictions model the geomechanical reservoir system for the timestep.

* * * * *